United States Patent
Lesso

(10) Patent No.: US 10,361,709 B2
(45) Date of Patent: Jul. 23, 2019

(54) CLOCK GENERATOR

(71) Applicant: Cirrus Logic International Semiconductor Ltd., Edinburgh (GB)

(72) Inventor: John P. Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/983,378

(22) Filed: May 18, 2018

(65) Prior Publication Data

US 2018/0269884 A1 Sep. 20, 2018

Related U.S. Application Data

(63) Continuation of application No. 15/009,405, filed on Jan. 28, 2016, now Pat. No. 10,003,344, which is a
(Continued)

(51) Int. Cl.
*H03L 7/099* (2006.01)
*H03L 7/08* (2006.01)
(Continued)

(52) U.S. Cl.
CPC ............. *H03L 7/099* (2013.01); *G06F 3/162* (2013.01); *H03G 5/00* (2013.01); *H03G 5/005* (2013.01);
(Continued)

(58) Field of Classification Search
CPC .......... H03G 5/00; H03G 5/005; H03G 5/025; H03G 5/165; H04R 3/04; H04S 7/307; H03L 7/08; H03L 7/087; H03L 7/14; H03L 7/18; H03L 2207/50

USPC .......... 381/7, 97, 98, 101, 124; 327/99, 291, 327/298; 331/2, 41, 46, 47, 49, 55, 56; 375/376, 354
See application file for complete search history.

(56) References Cited

U.S. PATENT DOCUMENTS 4,704,723 A 11/1987 Markland
5,256,994 A 10/1993 Langendorf
(Continued)

FOREIGN PATENT DOCUMENTS

CN 85 1 09031 A 12/1986
CN 1705234 A 12/2005
(Continued)

*Primary Examiner* — William A Jerez Lora
(74) *Attorney, Agent, or Firm* — Blank Rome LLP

(57) ABSTRACT

A clock generator receives first and second clock signals, and input representing a desired frequency ratio. A comparison is made between frequencies of an output clock signal and the first clock signal, and a first error signal represents the difference between the desired frequency ratio and this comparison result. The first error signal is filtered. A comparison is made between frequencies of the output clock signal and the second clock signal, and a second error signal represents the difference between the filtered first error signal and this comparison result. The second error signal is filtered. A numerically controlled oscillator receives the filtered second error signal and generates an output clock signal. As a result, the output clock signal has the jitter characteristics of the first input clock signal over a useful range of jitter frequencies and the frequency accuracy of the second input clock signal.

18 Claims, 16 Drawing Sheets

Related U.S. Application Data continuation of application No. 13/678,300, filed on Nov. 15, 2012, now Pat. No. 9,281,827.

(60) Provisional application No. 61/562,327, filed on Nov. 21, 2011.

(51) Int. Cl.
    *H03G 5/00*      (2006.01)
    *H03L 7/087*      (2006.01)
    *H03L 7/14*      (2006.01)
    *H03L 7/18*      (2006.01)
    *G06F 3/16*      (2006.01)

(52) U.S. Cl.
    CPC ............... *H03L 7/08* (2013.01); *H03L 7/087* (2013.01); *H03L 7/14* (2013.01); *H03L 7/18* (2013.01); *H03L 2207/50* (2013.01)

(56) References Cited

U.S. PATENT DOCUMENTS

| | | |
|---|---|---|
| 5,377,205 A | 12/1994 | Shi |
| 5,710,515 A * | 1/1998 | Teggatz ............... G01K 7/01 |
| | | 257/E23.08 |
| 5,832,024 A | 11/1998 | Schotz |
| 6,385,267 B1 | 5/2002 | Bowen et al. |
| 7,479,912 B1 | 1/2009 | Xianggang |
| 7,558,358 B1 | 7/2009 | Melanson |
| 7,680,236 B1 | 3/2010 | Melanson et al. |
| 7,746,972 B1 | 6/2010 | Melanson et al. |
| 2007/0001723 A1 | 1/2007 | Lin |
| 2008/0075152 A1 | 3/2008 | Melanson |
| 2009/0041104 A1 | 2/2009 | Bogdan |
| 2010/0045394 A1* | 2/2010 | Hanafi ............... H03B 5/04 |
| | | 331/167 |
| 2010/0134192 A1 | 6/2010 | Min et al. |
| 2010/0156575 A1 | 6/2010 | Shah et al. |
| 2011/0087347 A1 | 4/2011 | Hammond et al. |
| 2011/0145451 A1 | 6/2011 | Soffer |

FOREIGN PATENT DOCUMENTS

| | | |
|---|---|---|
| CN | 1893331 A | 1/2007 |
| EP | 2 378 666 A2 | 10/2011 |
| JP | 57-003403 | 1/1982 |
| JP | 57003403 * | 1/1982 |
| WO | WO 2008/132583 A1 | 11/2008 |

* cited by examiner

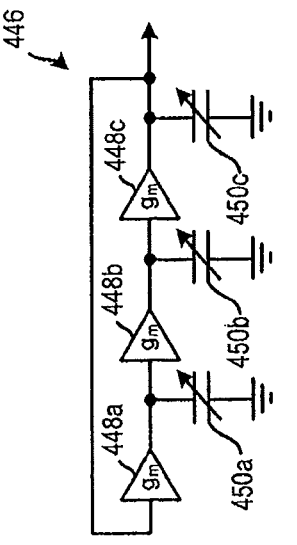
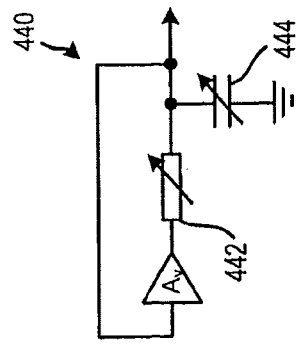
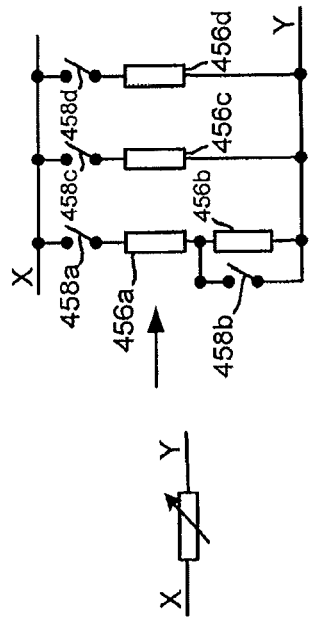
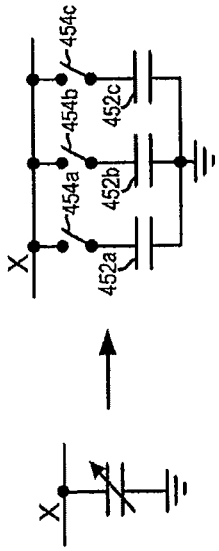
Figure 7(a)
Figure 7(b)
Figure 7(c)
Figure 7(d)

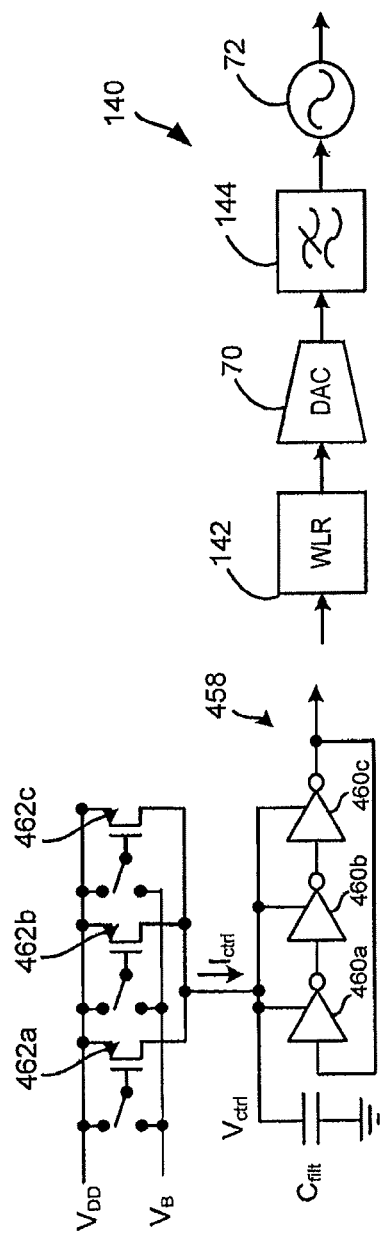

CLOCK GENERATOR

This is a continuation of application Ser. No. 15/009,405, filed on Jan. 28, 2016, which is a continuation of application Ser. No. 13/678,300, filed on Nov. 15, 2012, now U.S. Pat. No. 9,281,827, which claims the benefit of U.S. Provisional Application No. 61/562,327, filed on Nov. 21, 2011, the disclosures of which are incorporated by reference.

BACKGROUND OF THE INVENTION

1. Field of the Invention

This invention relates to a frequency locked loop, and in particular to a frequency locked loop suitable for use as a clock generator in integrated circuit form.

2. Description of the Related Art

It is known to use a frequency locked loop (FLL) to generate a clock signal at a frequency that is a multiple of the frequency of an existing (input) clock signal. For example, a high-frequency output clock clocks a counter. At edges of the existing clock signal, the accumulated count is latched and the counter is reset. Thus, the count represents the ratio of the frequency of the output clock to the frequency of the existing clock. This ratio is subtracted from an input value representing the desired ratio, and the resulting frequency error signal is fed to a filter. The filter integrates the frequency error to produce an integrated error signal, which is used to drive a numerically controlled oscillator, with the output of the numerically controlled oscillator being taken as the high-frequency output clock fed back to clock the counter. The feedback of the output clock means that, if its frequency becomes higher than the desired frequency, a negative frequency error signal is generated, causing the output frequency to be reduced. Conversely, if the frequency of the output clock becomes lower than the desired frequency, a positive frequency error signal is generated, causing the output frequency to increase. Thus the frequency of the generated clock converges to the desired frequency.

One application of such FLLs is in digital audio signal processing or reproduction circuitry, and in host devices employing such circuitry, including but not limited to, portable electronic devices, mobile phones, PDA's, netbooks, laptops, tablets, computers. For high quality audio reproduction it is important that the clock driving an output digital-to-analog converter has low jitter, especially in the audio frequency band, to avoid noise, distortion or spurious tones. The clock accompanying the input data may not be high quality, due to either a poor quality clock source or degradation along the transmission channel, and the clock for signal processing may need to be a multiple of the data transmission clock.

Also the generated clock must be closely synchronised to the incoming data: any accumulated clock slippage may result in dropped samples or gaps in the data to be processed.

Further, in some applications the clocks may be intermittent, perhaps due to the data being transmitted in bursts. Or the clock source may change as the modality of the host device is changed to service different use scenarios and to save any unnecessary power consumption. Yet any such clock transition should be undetectable in the reproduced audio.

Also preferably, for economic implementation in integrated circuit form, there should be minimal external components such as large capacitors: a predominantly digital solution is desirable.

SUMMARY OF THE INVENTION

According to a first aspect of the present invention, there is provided a clock generator, for generating an output clock signal, the clock generator comprising:

a first clock signal input, for receiving a first input clock signal;

a first frequency comparator, for generating a first frequency comparison signal based on a ratio of a frequency of the output clock signal to a frequency of the first input clock signal;

a first subtractor, for forming a first error signal representing a difference between an input desired frequency ratio and the first frequency comparison signal;

a first digital filter, for receiving the first error signal and forming a filtered first error signal;

a second clock signal input, for receiving a second input clock signal;

a second frequency comparator, for generating a second frequency comparison signal based on a ratio of a frequency of the output clock signal to a frequency of the second input clock signal;

a second subtractor, for forming a second error signal representing a difference between the filtered first error signal and the second frequency comparison signal;

a second digital filter, for receiving the second error signal and forming a filtered second error signal; and a numerically controlled oscillator, for receiving the filtered second error signal and generating the output clock signal.

According to a second aspect of the invention, there is provided an audio processing integrated circuit, comprising:

at least one digital audio interface, for receiving digital audio data with an accompanying audio data clock;

a digital-analog converter, for reconstructing analog audio data based on received digital audio data; and a clock generator according to the first aspect, wherein the audio data clock is provided to the clock generator as the first input clock signal, and the output clock signal of the clock generator is used as the clock for the digital-analog converter.

According to a third aspect of the invention, there is provided a device containing an audio processing integrated circuit according to the second aspect, and further comprising:

a communications processor for receiving cellular calls, the processor being coupled to the at least one digital audio interface via a digital audio bus; and/or an applications processor for retrieving audio data from local memory, the processor being coupled to the at least one digital audio interface via a digital audio bus; and/or a wireless modem for transmitting and/or receiving audio data from a peripheral device, the modem being coupled to the at least one digital audio interface via a digital audio bus.

According to a fourth aspect of the invention, there is provided an integrated circuit, comprising:

a clock generator according to the first aspect;

a first oscillator, for generating a first oscillator clock signal, and being connected to the first clock signal input of the clock generator; and a second oscillator, for generating a second oscillator clock signal, and being connected to the second clock signal input of the clock generator, wherein the first and second oscillators are configured such that the first oscillator clock signal has lower jitter than the second oscillator clock signal, and the second clock signal has higher frequency accuracy than the first oscillator clock signal.

BRIEF DESCRIPTION OF THE DRAWINGS

For a better understanding of the present invention, and to show how it may be put into effect, reference will now be made, by way of example, to the accompanying drawings, in which:

FIGS. 7(a), 7(b), 7(c), 7(d), 7(e), and 7(f) show in more detail possible forms of the numerical controlled oscillator in the frequency generator in accordance with the invention;

DETAILED DESCRIPTION OF THE PREFERRED EMBODIMENTS

Figure 1:
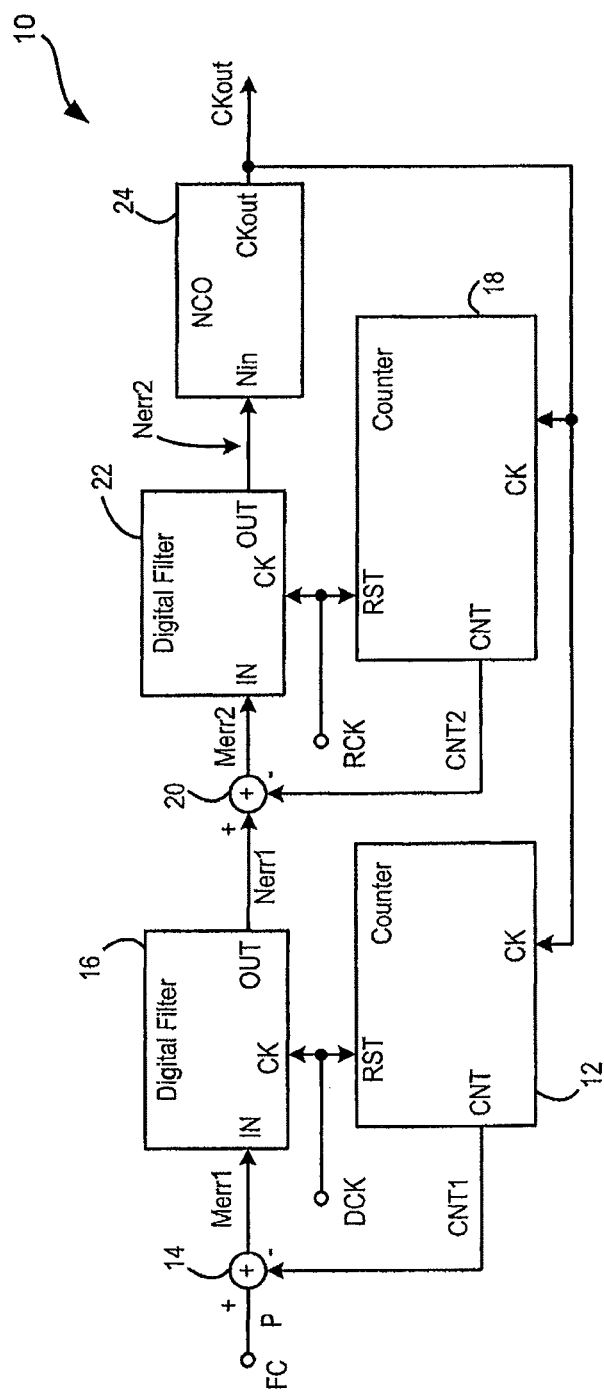
FIG. 1 is a schematic diagram illustrating the general form of a frequency generator in accordance with the invention.

FIG. 1 shows a clock generator (or equivalently a frequency generator or frequency synthesiser) 10, which operates using the principles of a frequency locked loop. The clock generator 10 can for example be provided in the form of an integrated circuit, or it can be provided as a functional block as part of a larger integrated circuit. The clock generator 10 receives a first input clock signal DCK, having a frequency $f_{DCK}$, and a second input clock signal RCK, having a frequency $f_{RCK}$, and generates an output clock signal CKout, having a frequency $f_{CKout}$. The clock generator 10 also receives, at a frequency control input FC, an input value or frequency control word P, which represents the desired value of the ratio of the frequencies of the output clock signal CKout and the first input clock signal DCK. Thus, where a user wishes to generate an output clock signal CKout having a frequency $f_{CKout}$, and has a clock signal DCK at a frequency $f_{DCK}$ available, the value of P is set to be equal to $f_{CKout}/f_{DCK}$.

The output clock signal CKout is applied to the clock input (CK) of a first counter 12, acting as a first frequency detector or first frequency comparator. The first input clock signal DCK is applied to the reset (RST) input of the first counter 12. Thus, the first counter 12 counts the number of pulses of the output clock signal CKout that are generated in each pulse of the first input clock signal DCK, and the count value CNT1 output from the first counter 12 is a first frequency comparison signal, representing the ratio of the frequencies of the output clock signal CKout and the first input clock signal DCK, i.e. CNT1=$f_{CKout}/f_{DCK}$.

The input value P input at the frequency control input FC is applied to a first input of a first subtractor 14, and the count value CNT1 output from the first counter 12, i.e. the first frequency comparison signal, is applied to a second input of the subtractor 14. The resulting first error signal Merr1 is applied to the input (IN) of a first digital filter 16, which is clocked by the first input clock signal DCK, and generates on its output (OUT) a first filtered error signal Nerr1. First digital filter 16 may be an integrator or some other type of low pass filter with higher gain at low frequencies and lower gain at higher frequencies.

The output clock signal CKout is also applied to the clock input (CK) of a second counter 18, acting as a second frequency detector or second frequency comparator. The second input clock signal RCK is applied to the reset input (RST) of the second counter 18. Thus, the second counter 18 counts the number of pulses of the output clock signal CKout that are generated in each pulse of the second input clock signal RCK, and the count value CNT2 output from the second counter 18 is a second frequency comparison signal, representing the ratio of the frequencies of the output clock signal CKout and the second input clock signal RCK i.e. CNT2=$f_{CKout}/f_{RCK}$.

The first filtered error signal Nerr1 is applied to a first input of a second subtractor 20, and the count value CNT2 output from the second counter 18, i.e. the second frequency comparison signal, is applied to a second input of the second subtractor 20. The resulting second error signal Merr2 is applied to the input (IN) of a second digital filter 22, which is clocked by the second input clock signal RCK, and generates on its output (OUT) a second filtered error signal Nerr2. The second digital filter 22 may be an integrator or some other type of low pass filter with higher gain at low frequencies and lower gain at higher frequencies The second filtered error signal Nerr2 is passed to a numerically controlled oscillator (NCO) 24, which generates the output clock signal CKout in dependence on its input signal Nerr2.

In some embodiments the digital filters 16 and 22 are integrators, or other type of low pass filters, with higher gain at low frequencies than at higher frequencies. Thus for bounded output values, the average input value of each integrator 16, 22 must be close to zero. The operation of the frequency generator 10 can be understood by considering that, in a steady state, the feedback loops must operate such that the output signal Merr1 of the first subtractor 14 tends towards zero, that is, such that:

$$\text{Merr1} = P - \text{CNT1} = 0, \text{ i.e.}$$

$$P = f_{CKout}/f_{DCK}, \text{ or}$$

$$f_{CKout} = P \cdot f_{DCK}$$

In this embodiment, the value of P is constant, or at least changes relatively slowly over time compared to any of the generated frequencies or loop bandwidths, so that the frequency of the output clock $f_{CKout}$ tracks a slowly varying required value.

Similarly, it may be shown that:

$$\text{Merr2} = \text{Nerr1} - \text{CNT2} = 0, \text{ i.e.}$$

$$\text{Nerr1} = f_{CKout}/f_{RCK},$$

i.e. the output of integrator 16 settles out to an average value equal to $f_{CKout}/f_{RCK}$.

In steady state, the output of the second filter 22 will settle out to the value required by the NCO 24 to provide the desired frequency $P \cdot f_{DCK}$ at CKout.

Figure 2:
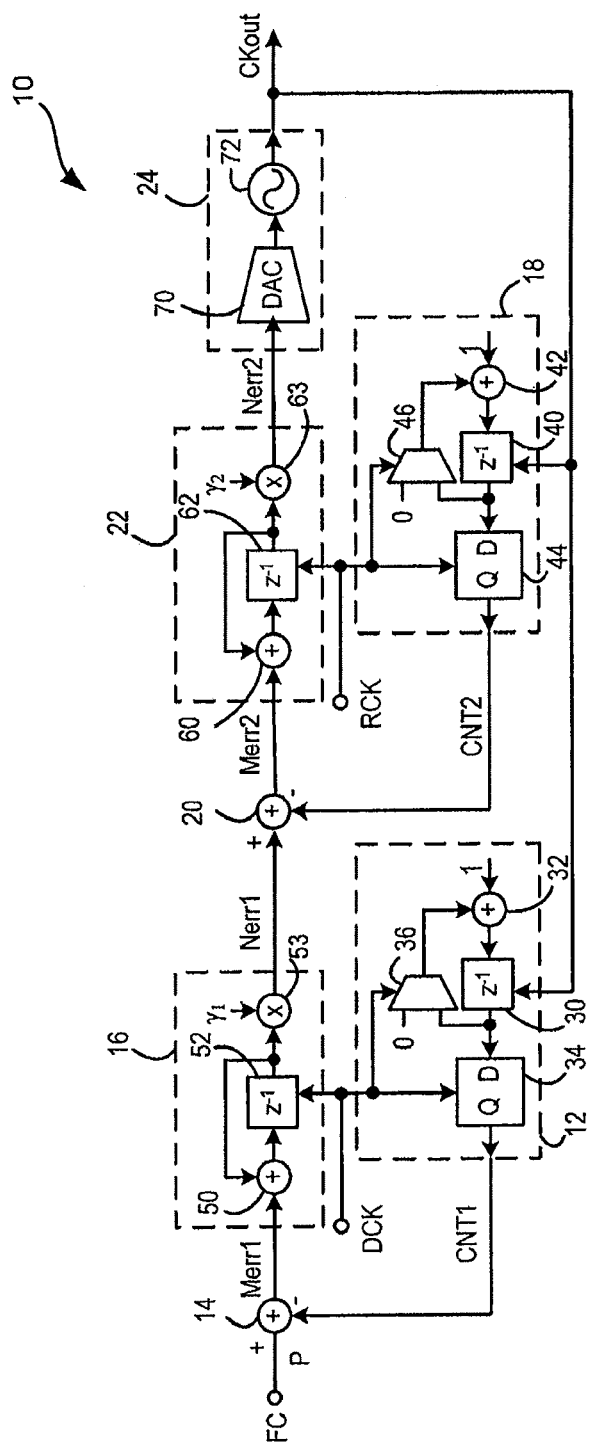
FIG. 2 shows in more detail a frequency generator as shown in FIG. 1.

FIG. 2 shows in more detail the form of the frequency generator 10, in one specific embodiment.

As shown in FIG. 2, the first counter 12 includes a delay element 30, which is clocked by the output clock CKout, with the result that an adder 32 adds the received value +1 to a current count value for each pulse of the output clock CKout. A multi-bit storage register 34 (drawn as a single-bit D-type flip-flop for simplicity) receives the current count value in each time period, and, on each rising, edge of the first input clock DCK, the accumulated count is latched and output to the first subtractor 14. At the same time, the rising, edge of the first input clock DCK controls a multiplexer 36, so that the value 0 is passed to the adder 32. This resets the counter value of the first counter 12 to zero until the next CKout pulse arrives There are many possible implementations of this counter block 12: for example the multiplexer could be omitted so that the output of the delay block continually increments, and then at each rising edge of the first input clock DCK the previously delivered output value is subtracted. Of course, this and other blocks could be designed to be triggered on falling instead of rising edges.

Thus, the accumulated count value CNT1 output to the first subtractor 14, i.e. the first frequency comparison signal, is the number of pulses of the output clock CKout for each period of the first input clock DCK, and is made available to the subtractor 14 for as long as is necessary.

Similarly, the second counter 18 may include a delay element 40, which is clocked by the output clock CKout, with the result that an adder 42 adds the received value +1 to a current count value for each pulse of the output clock CKout. A multi-bit storage register 44 receives the current count value in each time period, and, on each rising edge of the second input clock RCK, the accumulated count is latched, i.e. output to the second subtractor 20. At the same time, the rising edge of the second input clock RCK controls a multiplexer 46, so that the value 0 is passed to the adder 42. This resets the counter value of the second counter 18. Again alternative implementations of suitable counters are possible.

Thus, the accumulated count value CNT2 output to the second subtractor 20, i.e. the second frequency comparison signal, is the number of pulses of the output clock CKout for each period of the second input clock RCK, and is made available to the second subtractor 20 for as long as is necessary.

In the embodiment shown in FIG. 2, the first filter 16 takes the form of an integrator, comprising an adder 50, a delay element 52, which is clocked by the first input clock DCK, and a multiplier 53, with the result that, during each period of the first input clock DCK, the value Merr1 received from the first subtractor 14 is added to the previous running total output from delay element 52 to form a new running total, which is then scaled by a factor $\gamma_1$, to form the new filter output value Nerr1. The multiplier may just be a bit-shifter, to implement a scaling factor $\gamma_1$ of the form $2^N$, or some other simple shift-and-add structure to implement a scaling factor $\gamma_1$ of the form $2^{N1}+2^{N2}$ or similar, rather than a full multiplier, as is known.

Similarly the second filter 22 takes the form of an integrator of similar structure, comprising an adder 60, a delay element 62, which is clocked by the second input clock RCK, and a multiplier 63, with the result that, during each period of the second input clock RCK, the value Merr2 received from the second subtractor 20 is added to the previous running total output from delay element 62 to form a new running total, which is then scaled by a factor $\gamma_2$, to form the new filter output value Nerr2.

As shown in FIG. 2, the numerically controlled oscillator (NCO) 24 may include a digital-analog converter (DAC) 70 and a voltage controlled oscillator (VCO) 72, and so it generates the output signal CKout at a frequency that corresponds to the numerical value output by the second integrator 22.

In this illustrated embodiment, the first integrator 16 is designed to have a much lower gain (that is to say, a longer time constant) than the second integrator 22.

Figure 3:
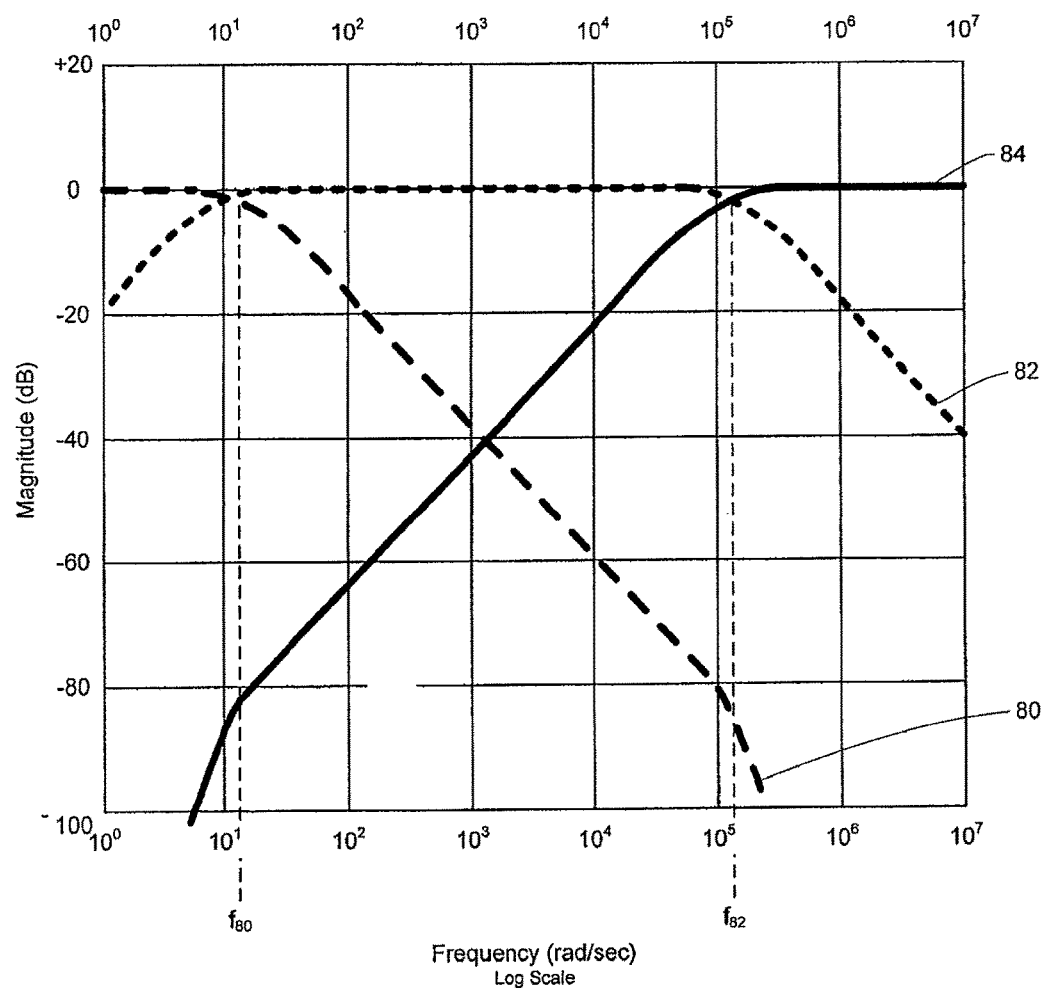
FIG. 3 is a frequency plot, illustrating the properties of the frequency generator of FIG. 2.

FIG. 3 is a frequency plot, illustrating the jitter transfer functions between various points in the circuit of FIG. 2. Specifically, the plot line 80 represents the jitter transfer function from the DCK input to the NCO output CKout, i.e. the factor by which any jitter at a particular frequency present on the DCK input is scaled by when it reaches the output CKout. Similarly, the plot line 82 represents the jitter transfer function from the RCK input to the NCO output CKout, and the plot line 84 represents the jitter transfer function from the input of the NCO 24 to its output CKout.

The break points are defined by the unity gain frequencies of the first and second integrators 16, 22. More specifically, the break point $f_{80}$ of the transfer function from the DCK input to the NCO output CKout, i.e. plot line 80, is given by $f_{80}=f(DCK)^*\gamma_1/2\pi$, where $\gamma_1$ is the gain of the first integrator 16, and the break point $f_{82}$ of the transfer function from the RCK input to the NCO output CKout, i.e. plot line 82, is given by $f_{82}=f(RCK)^*\gamma_2/2\pi$, where $\gamma_2$ is the gain of the second integrator 22.

In this example, these gain values are set such that the break point $f_{80}$ is at approximately 2 Hz (12 rad/s), while the break point $f_{82}$ is at approximately 20 kHz (120 krad/s). As the integrators 16, 22 are both first-order integrators, the slopes of the jitter transfer functions 80, 82, 84 are generally 20 dB/decade, except that the NCO transfer function 84 has a slope of 40 dB/decade below the lower break point $f_{80}$, and the RCK transfer function 80 has a slope of minus 40 dB/decade above the upper break point $f_{82}$.

Thus at intermediate jitter frequencies, between the two break points $f_{80}$ and $f_{82}$, the long time constant of the first integrator 16 will tend to keep its output Nerr1 constant, and so very little jitter from the first clock signal DCK will propagate to the output, whereas the second integrator 22 will have high gain, and thus the feedback loop comprising it and frequency comparator 18 will control the NCO 24 so that its output CKout follows the second clock signal RCK, despite the inherent jitter of the NCO 24.

Thus, at these intermediate frequencies, the jitter on the output clock CKout will tend to follow the jitter on the second clock signal RCK, and jitter on the first clock signal DCK will be attenuated by 6 dB at 4 Hz and much more at higher frequencies.

As a result, the circuit shown in FIG. 2 is particularly useful in situations where there are available two clock signals, with one having a frequency that it is desired to use as the basis for generating an output clock signal CKout, but which is of relatively low quality (i.e. it has relatively high jitter), and the other being of relatively high quality (low jitter) but an inappropriate frequency. In that case, the relatively high jitter clock signal can be used as the first input clock signal DCK to the circuit 10, and the relatively low jitter clock signal can be used as the second input clock signal RCK.

This means that the output clock signal CKout can be generated from the first input clock signal DCK at a desired exact frequency ratio by suitable choice of a value for P, but that (within the frequency band of interest) the jitter on the output clock signal CKout is only dependent on the low level of jitter on the high quality second input clock signal RCK, provided that the gains of the integrators 16, 22 are set appropriately.

As mentioned above, in this illustrated embodiment, the first integrator 16 is designed to have a much longer time constant than the second integrator 22. However, the first integrator 16 could have a shorter time constant than the second integrator 22.

As mentioned above, the integrators 16, 22 are both first-order integrators in this embodiment. However, it will be appreciated that higher order integrators could be used, or indeed other filters depending on the anticipated jitter spectrum of the input clocks or the jitter spectrum desired at the output. For instance, it may be desired to notch out known interference frequencies, in which case filter 16 might be a notch filter and filter 22 a bandpass filter, with parameters designed to maintain stability of the two feedback loops.

As described above, the integrator 16 settles out to an average value equal to $f_{CKout}/f_{RCK}$. On start-up, typically all circuitry will be reset to zero, so this low-bandwidth integrator may take some time to ramp up to the required value.

Figure 4:
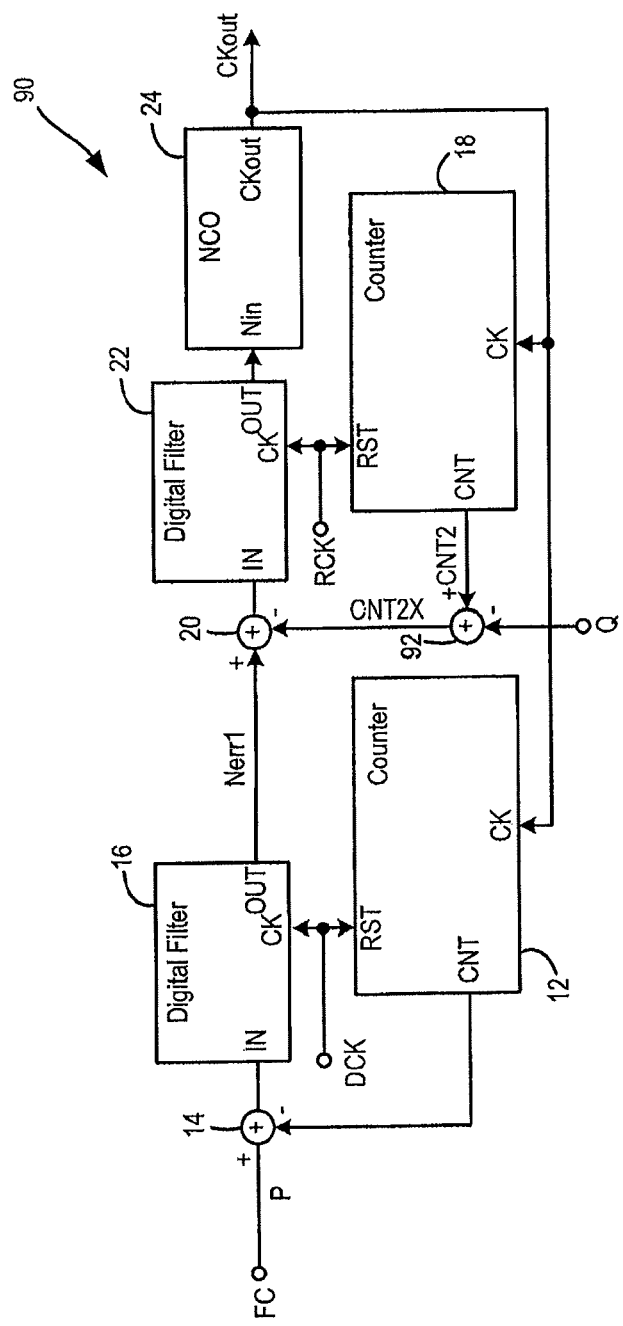
FIG. 4 shows a first alternative frequency generator in accordance with the invention.

FIG. 4 shows an alternative frequency generator 90, in which many of the component blocks are the same as the component blocks of the frequency generator 10. These component blocks are indicated by the same reference numerals in FIG. 4 as in FIGS. 1 and 2, and are not described further.

In the frequency generator 90 shown in FIG. 4, the count (CNT2) output of the second counter 18 is applied to a first input of a third subtractor 92, and an input value Q equal to the expected or nominal value of $f_{CKout}/f_{RCK}$ is applied to a second input of the third subtractor 92 to be subtracted from CNT2. A frequency comparison signal CNT2X is obtained as the result of this subtraction, and this is applied to the second subtractor 20 to be subtracted from the filtered error signal Nerr1.

In operation, the output value CNT2 of second counter 18 must still on average be equal to $f_{CKout}/f_{RCK}$, but subtracting Q from CNT2 will give a value close to zero, if RCK is near the expected frequency. The new error signal CNT2X forwarded to the second subtractor will now be small, so the first integrator 16 need only ramp up to settle out at a much smaller value, i.e. just the error ($f_{CKout}/f_{RCK}$–Q) in the estimated Q rather than the full amount of Q. Thus the time taken to settle to an acceptable accuracy may be greatly reduced.

As an equivalent alternative, the second counter 18 could be preset to a count value of –Q, so that it then ramps up to a value close to zero during each RCLK cycle, rather than using an explicit subtractor 92. As a further equivalent alternative, the output of integrator 16 could be preset to Q on start-up.

Figure 5:
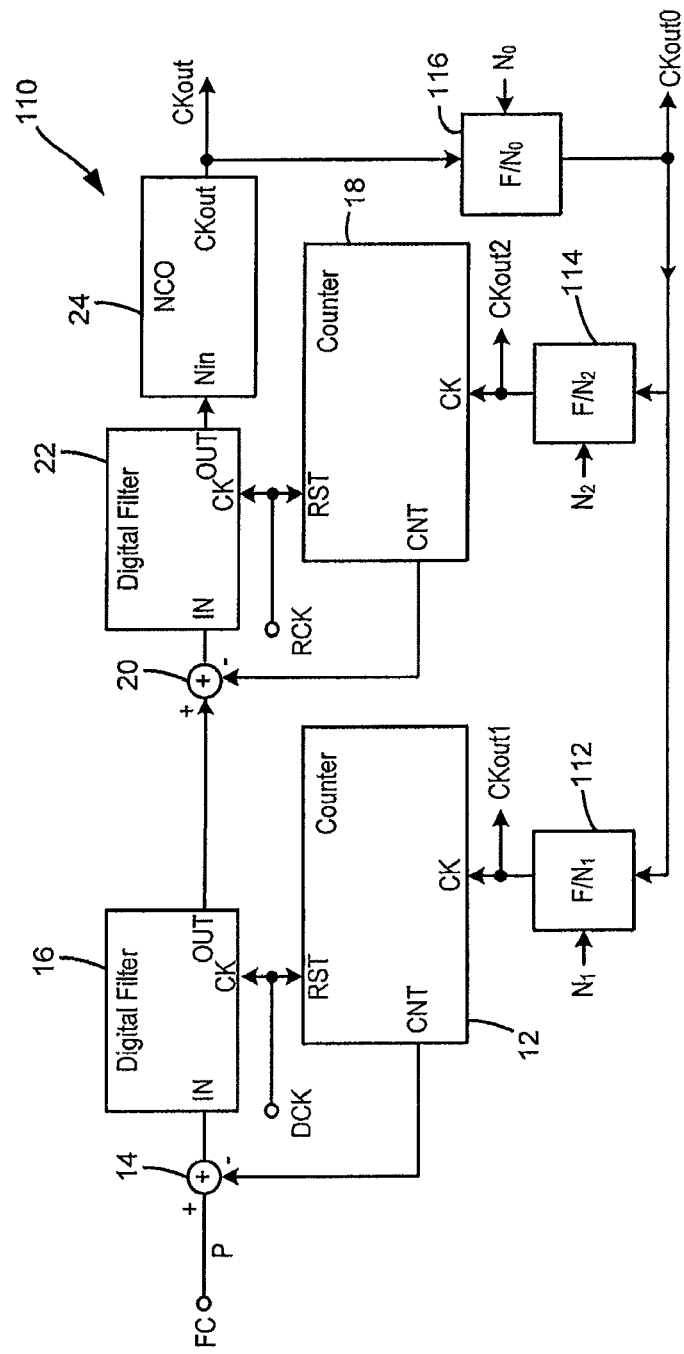
FIG. 5 shows a second alternative frequency generator in accordance with the invention.

FIG. 5 shows a further alternative frequency generator 110, in which many of the component blocks are the same as the component blocks of the frequency generator 10. These component blocks are indicated by the same reference numerals in FIG. 5 as in FIGS. 1 and 2, and are not described further.

In the frequency generator 110 shown in FIG. 5, the output clock CKout is not passed directly to the first counter 12 and the second counter 18, but is instead passed through a common frequency divider 116 and then separately through a first frequency divider 112 and a second frequency divider 114 respectively. The common frequency divider 116 receives a common frequency division ratio $N_0$ and generates a common frequency divided clock signal CKout0 at a frequency $f_{CKout}/N_0$. The first frequency divider 112 receives a first frequency division ratio $N_1$ and generates a first frequency divided clock signal CKout1 at a frequency $f_{CKout}/N_0N_1$, which it supplies to the clock (CK) input of the first counter 12. Similarly, the second frequency divider 114 receives a second frequency division ratio $N_2$ and generates a second frequency divided clock signal CKout2 at a frequency $f_{CKout}/N_0N_2$, which it supplies to the clock (CK) input of the second counter 18.

The common, first, and second frequency dividers 116, 112, 114 may be fixed dividers, and they have the effect that the first and second counters 12, 18 can run more slowly than if they are supplied with the output clock CKout directly, which has the advantages that power consumption is reduced, and that the counters 12, 18 are only required to be able to count to smaller values, without seriously affecting the accuracy of the frequency $f_{CKout}$ or the jitter of the output clock CKout. If required, the common frequency divided clock signal Ckout0, first frequency divided clock signal CKout1 and/or the second frequency divided clock signal CKout2 can be provided as a clock signal to other blocks of a larger circuit. Depending on requirements, one of more of frequency dividers 112, 114, 116 may be unnecessary and omitted.

Alternatively, one or more of these frequency dividers may be configurable during operation, by altering the values of N1 and/or N2, to accommodate different modes of operation with different input clock frequencies or different system requirements. The frequency dividers may be implemented as chains of divide-by-2 stages to implement frequency division ratios of the form $2^N$, or may be a counter including decode and appropriate reset logic or other similar techniques as known.

In some applications, one or both of the input clock signals (DCK, RCK) may not always be present. It is desirable that some output clock is still maintained in such circumstances, to allow at least some continuing operation of parts of the host system.

In the embodiments described above, if the first input clock signal DCK goes away, while the second input clock signal RCK is still present, then the filtered error signal Nerr1 becomes constant, and the NCO 24 is controlled only by the loop including the second counter 18. This loop will maintain the output frequency at a frequency based on the frozen value of Nerr1 and the frequency of RCK.

If, alternatively, in the embodiments described above, the second input clock signal RCK goes away, the second digital filter 22 will become unclocked, and so its output Nerr2 will remain at its last value. This will cause the NCO output frequency to become constant, at a frequency corresponding to this value.

Figure 6:
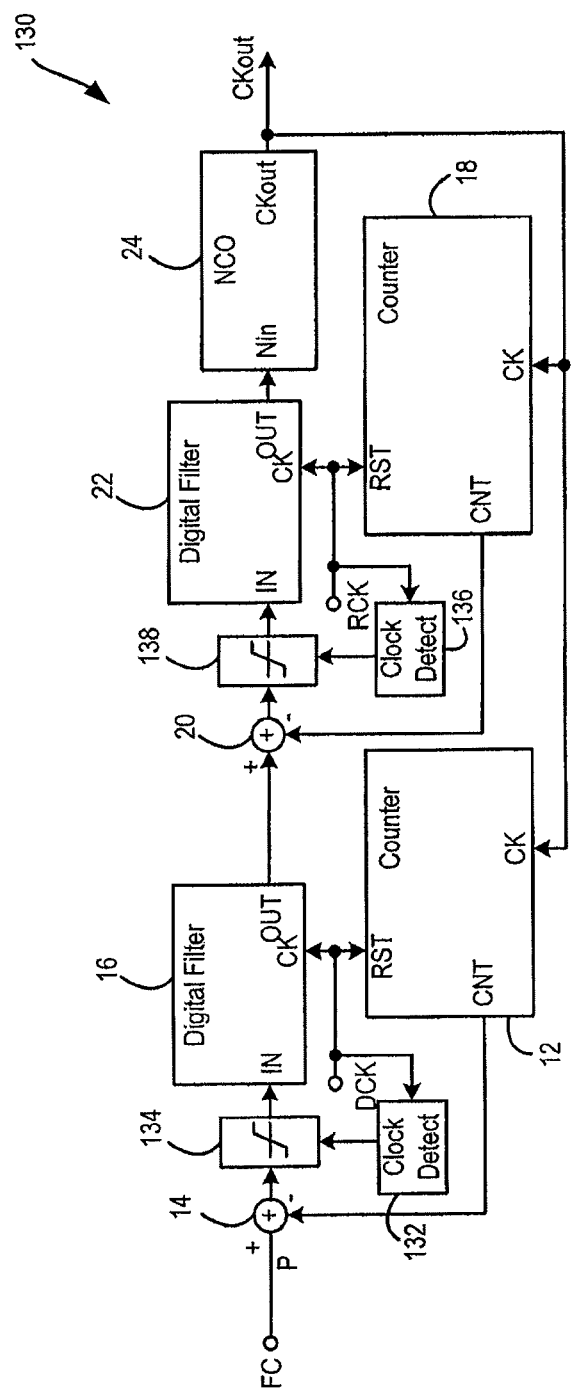
FIG. 6 shows a third alternative frequency generator in accordance with the invention.

FIG. 6 shows a further alternative frequency generator 130, in which many of the component blocks are the same as the component blocks of the frequency generator 10. These component blocks are indicated by the same reference numerals in FIG. 6 as in FIGS. 1 and 2, and are not described further.

In the frequency generator 130 shown in FIG. 6, a first clock detector 132 is connected to the input receiving the first clock signal DCK, and is used to control a first limiter block 134. Similarly, a second clock detector 136 is connected to the input receiving the second clock signal RCK, and is used to control a second limiter block 138.

The clock detectors 132, 136 and limiter blocks 134, 138 are provided to deal with issues that can arise if the input clocks become temporarily unavailable. For example, if the first clock signal DCK goes away, it may have a slightly different frequency when it reappears (perhaps because a frequency of an upstream clock generator has drifted with a variation in temperature, or perhaps even because it is being derived from a different clock source). If the second clock RCK goes away, the NCO 24 runs open-loop for a while and its frequency may have drifted by the time that the RCK signal reappears. The step changes in effective input clock frequencies due to the sudden reimposition of the clocks may give large step transients in the frequency comparison signals which may stimulate the feedback loops to produce a noticeable output frequency transient overshoot.

The frequency generator 130 shown in FIG. 6 helps to mitigate these problems in that the clock detector 132, 136 detects when the respective clock signal DCK, RCK is not present, and then detects when it reappears. The clock detector 132, 136 then limits the input to the respective digital filter 16, 22 during a recovery period after the clock signal reappears, in order to help reduce any large-signal transient overshoots within the loops and thus reduce any transient overshoots in the output frequency.

The numerically controlled oscillator (NCO) 24 can take many possible forms. FIG. 2 shows an NCO 24 comprising a voltage-output DAC 70 driving a voltage-controlled oscillator 72. As one alternative, FIG. 7(a) shows an NCO in the form of a simple RC oscillator 440 with digitally programmable resistor elements 442 and capacitor elements 444, while FIG. 7(b) shows an NCO in the form of a transconductance/capacitor (Gm-C) ring oscillator 446, again with digitally programmable resistor elements 448a, 448b, 448c and capacitor elements 450a, 450b, 450c.

FIG. 7(c) shows in more detail one possible form of the programmable capacitor elements 444 or 450, having multiple capacitors 452a, 452b, 452c connectable in parallel combinations by means of switches 454a, 454b, 454c, these switches comprising MOS transistors or other suitable active devices. In other embodiments, some or all of the capacitors making up a programmable capacitor element can be connectable in series to other capacitors.

FIG. 7(d) shows in more detail the form of the programmable resistor element 442, having multiple resistors 456a, 456b, 456c, 456d, connectable in series or in parallel combinations by means of switches, these switches comprising MOS transistors or other suitable active devices.

Thus, In FIGS. 7(c) and 7(d), respective bits of a binary signal representing the numerical input or derived therefrom can control which of the capacitors and resistors are connected, and can thus control the frequency of the oscillator.

FIG. 7(e) shows an alternative NCO, in which the oscillator element is a ring oscillator 458 where the supply current is digitally controllable. (Similarly, the supply voltage or other bias voltage of a ring oscillator might be digitally controllable.) Thus, in FIG. 7(e), the ring oscillator 458 comprises three inverting stages 460a, 460b, 460c (possibly simple CMOS inverter stages), although of course any convenient number of such inverters can be provided. Three PMOS transistors 462a, 462b, 462c are provided in an array, and respective bits of a binary signal representing the numerical input can control whether the gates of the PMOS transistors are connected to a suitable bias voltage $V_B$ or to a supply voltage $V_{DD}$. Gates that are connected to the bias voltage $V_B$ contribute to the total current $I_{ctrl}$ that is available to drive the inverter chain and thus control the supply voltage $V_{ctrl}$ and output frequency of the ring oscillator 458.

The output of the digital filter will however typically be 20 to 30 bits wide, whereas it is impracticable to provide enough passive elements to provide such a high resolution directly. In order to mitigate this problem, word length reduction techniques may be used.

FIG. 7(f) shows a possible form of numerically controlled oscillator (NCO) 140, which can be used in place of the numerically controlled oscillator (NCO) 24 described above. The numerically controlled oscillator (NCO) 140 comprises a digital-analog converter (DAC) 70 and a voltage controlled oscillator (VCO) 72, which have the same functions as the blocks indicated by the same reference numerals in FIG. 2, and these will not be described further. In the numerically controlled oscillator (NCO) 140, the value output by the second digital filter 22 is passed first to a word-length reduction (WLR) circuit 142, such as a noise-shaper or a delta-sigma modulator. This helps to ensure that any noise that results from quantising the value is pushed out to higher frequencies, where it will not produce any noticeable effects in the output jitter at low and medium frequencies. It is the output of the word-length reduction (WLR) circuit 142 that is then passed to the digital-analog converter (DAC) 70.

The output of the digital-analog converter (DAC) 70 may be passed to an analog low-pass filter 144 to further help attenuate quantisation noise introduced by the DAC 70, and to help decouple any other high frequency noise against the local ground of the VCO. It is the low-pass filtered signal that is then passed to the voltage controlled oscillator (VCO) 72, to generate the output signal CKout at a frequency that corresponds to the numerical value output by the integrator 22.

This allows a relatively low resolution (perhaps 6-bits) DAC to have a much finer effective d.c. resolution (say 16 bits) in terms of the average value applied to the VCO and the respective output frequency accuracy.

Similarly a word length reduction circuit may be used to control the programmable resistor and/or capacitor elements in the structures shown in FIG. 7(a) or 7(b), or the PMOS transistors in the structure shown in FIG. 7(e). In the case of FIG. 7(e), the capacitor $C_{filt}$ will act as a low-pass filter element.

Thus far, the value of P applied to the frequency control input FC has been assumed to be constant over time, or at least to be changing slowly over time compared to any of the generated frequencies or loop bandwidths, so that the frequency of the output clock tracks a slowly varying required value corresponding to P.

Alternatively, the variation can be fast enough, that is, in excess of the FLL loop bandwidth, that the effect of the first and second low pass filters 16, 22 is to cause the average frequency of the output clock $f_{CKout}$ to depend on an average value of P, and for any modulation of this frequency to be insignificant. For instance P may alternate rapidly between two or more adjacent values such that their average represents the desired frequency, or the input value P applied to the first input of the first subtractor 14 may be any sequence or stream of values having desired properties in terms of its average value and quantisation noise spectrum, and can, for example, be the stream of multi-bit or one-bit words output from a multi-bit or one-bit sigma-delta modulator.

Figure 8:
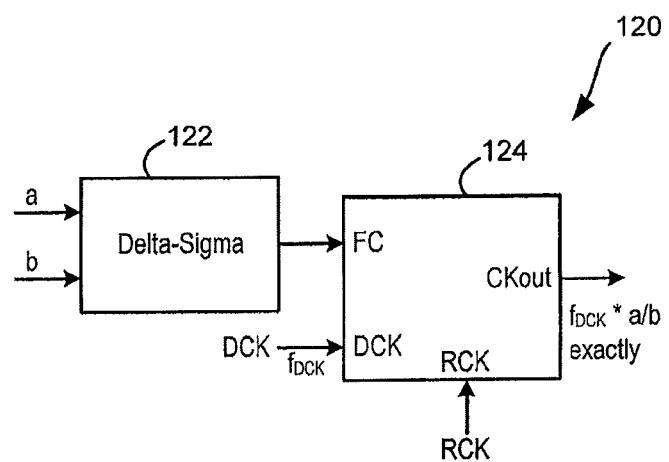
FIG. 8 shows a first system including a frequency generator in accordance with the invention.

FIG. 8 shows a further alternative frequency generator 120, in which inputs having numerical values "a" and "b" are input to a modulator 122, for example a delta-sigma modulator, to generate a stream of output values having the average value a/b. An exact fractional average output value can therefore be obtained by supplying integer values a and b. The stream of output values is supplied to a frequency generator sub-block 124 to serve as a frequency control word applied to the input FC. The frequency generator sub-block 124 can take the form of any of the frequency generators described herein, namely the frequency generators 10, 90, 110, 130, and the stream of output values is supplied as the input desired value P for the frequency ratio. Thus, if it is desired to generate an output clock signal at a frequency that is an exact fractional multiple of the frequency of an available clock, the modulator 122 can be used to generate the desired value for the multiple by choosing suitable values of a and b, and this can be supplied as the desired multiplication factor, P, in the form of the stream of modulator output values to the frequency generator sub-block 124.

Figure 9:
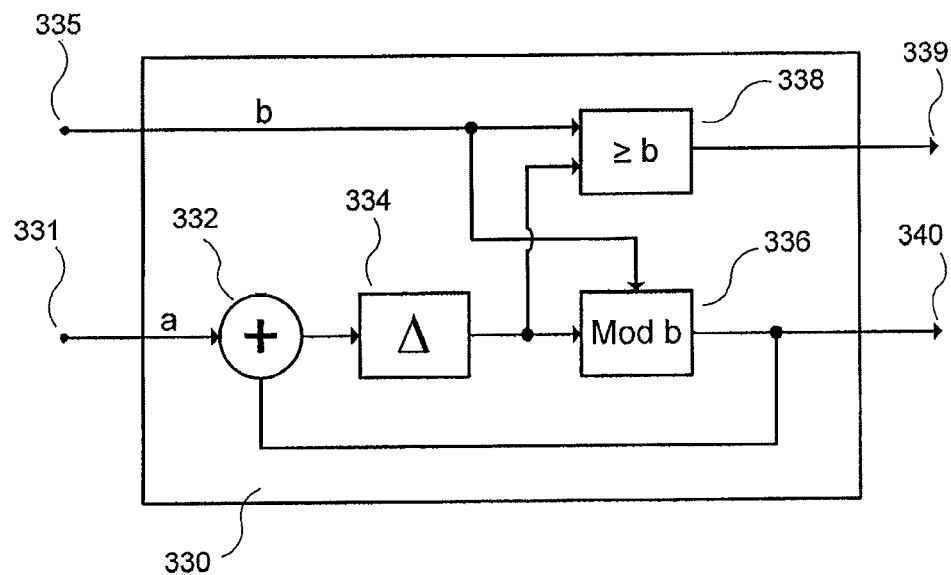
FIG. 9 shows a first possible form of the delta-sigma modulator in the system of FIG. 8.

FIG. 9 illustrates a first order delta sigma modulator 330 for use as the modulator 122 in an embodiment of the present invention. Delta sigma modulator 330 comprises a first input terminal 331 for receiving a first input value a. An addition element 332, which may be an adder, receives the first input value a from the first input terminal 331. A memory element 334 is coupled to the output of the addition element 332 and maintains an accumulated count. The output of the memory element 334 is coupled to a modulus element 336 and a comparison element 338, which may be a comparator. Delta sigma modulator 330 also comprises a second input terminal 335 for receiving a second input value b that is provided to the modulus element 336 and the comparison element 338. Comparison element 338 provides a first output, m, on one output line 339 and modulus unit 336 provides a second output, ε, on a second output line 340, which is also fed back to the addition element 332.

Thus, delta sigma modulator 330 has two input terminals 331, 335 for receiving first and second input values a and b. Input a represents the numerator of the fractional input and input b represents the denominator of the fractional input. The first and second input values a and b are therefore chosen such that a/b=P.

Preferably, although not necessarily, input values a and b are selected so that they are coprime, i.e. they have no common factors other than one, in order to eliminate tones in the output of the delta sigma modulator 330. If input values a and b are not coprime, tones that may be present in the output may compromise performance, particularly in audio systems. However other non-audio systems may be capable of tolerating such a compromise.

The value of b can be represented by a binary word, and in particular the binary word may have more than one non-zero bit, and thus b need not be of the form $2^N$.

In delta sigma modulator 330, the addition element 332 adds the first input value a to the accumulated count until the comparison unit 338 determines that the accumulated count maintained in the memory element 334 is greater than or equal to a threshold value, b. When the accumulated count is greater than or equal to the threshold value, b, an output pulse is produced at output 339 and the counter is reset by the modulus element 336. That is, the modulus element performs a modulus operation on its inputs, subtracting the value b from the count value received from the memory element 334, repeatedly if necessary, until the result is less than b. Thus, in delta sigma modulator 330, the threshold value is set by the second input value b, which sets the modular point of the delta sigma modulator.

The modular point, or rollover point, of the delta sigma modulator is the threshold value, b, which when exceeded by the accumulated count, causes a pulse to be outputted at output 339, and the count to be reset.

The ability to set the modular point to the second input value b, enables the delta sigma modulator to synthesise according to base b. The average value of the pulse density of output 339 is therefore exactly equal to a/b, because the synthesis is quantised to b which is the denominator of the input a/b. The ability to use a value of b that is not of the form $2^N$ allows a much wider range of frequencies to be synthesised exactly, rather than with a ratio rounded to a certain number of binary places.

In the situation where the accumulated count exceeds the threshold value, the excess that the accumulated count is greater than the threshold value is carried over (rolled over) as a remainder at the start of the next addition cycle.

Output terminal 340 outputs the error value, ε, of the delta sigma modulator 330. The error value is reduced in higher order delta sigma modulators because it is cascaded to subsequent delta sigma modulation stages. In first order delta sigma modulators, such as the delta sigma modulator 330 shown in FIG. 9, the error value is discarded.

The present invention is not limited to first order delta sigma modulators and can also be used in higher order modulators. A higher order modulator contains at least two delta sigma modulation stages and a recombination stage at the outputs of the stages to combine the outputs to produce a pulse density modulated output.

Figure 10:
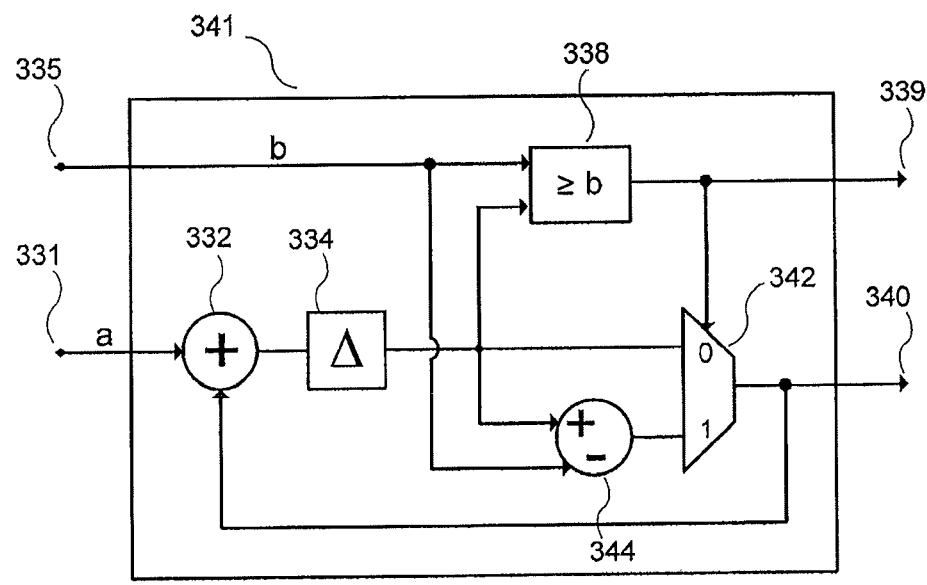
FIG. 10 shows a second possible form of the delta-sigma modulator in the system of FIG. 8.

Traditionally, modulus operations such as the one performed by modulus unit 336 are computationally expensive. FIG. 10 shows an alternative delta sigma modulator 341 for use in an embodiment of the present invention, in which the modulus unit is simplified to a multiplexer 342 and a subtractor 344.

Delta sigma modulator 341 operates in a similar manner to that described in relation to delta sigma modulator 330 of FIG. 9. The first input value a from input terminal 331 is added by the addition element 332 to an accumulated count maintained in memory element 334. The accumulated count is inputted to the multiplexer 342, along with the accumulated count minus an input value b, inputted from input terminal 335, from subtractor 344. The multiplexer 342 selects an output from one of these inputs depending on whether the comparison element 338 determines that the accumulated count is greater than or equal to input value b. If comparison element 338 determines that the accumulated count is greater than or equal to input value b, comparison element 338 outputs a pulse at output 339, which is also passed to the multiplexer 342 indicating that multiplexer 342 should select the output with the accumulated count minus input value b for feed back to the addition element 332. This simplified circuit is an acceptable replacement for the circuit shown in FIG. 9, if it is known that the relationship between the values of a and b will be such that repeated subtraction of the value b will not be required. Being a simplified circuit, this will have the advantage of a smaller chip area and hence lower cost, and also have lower power consumption.

Figure 11:
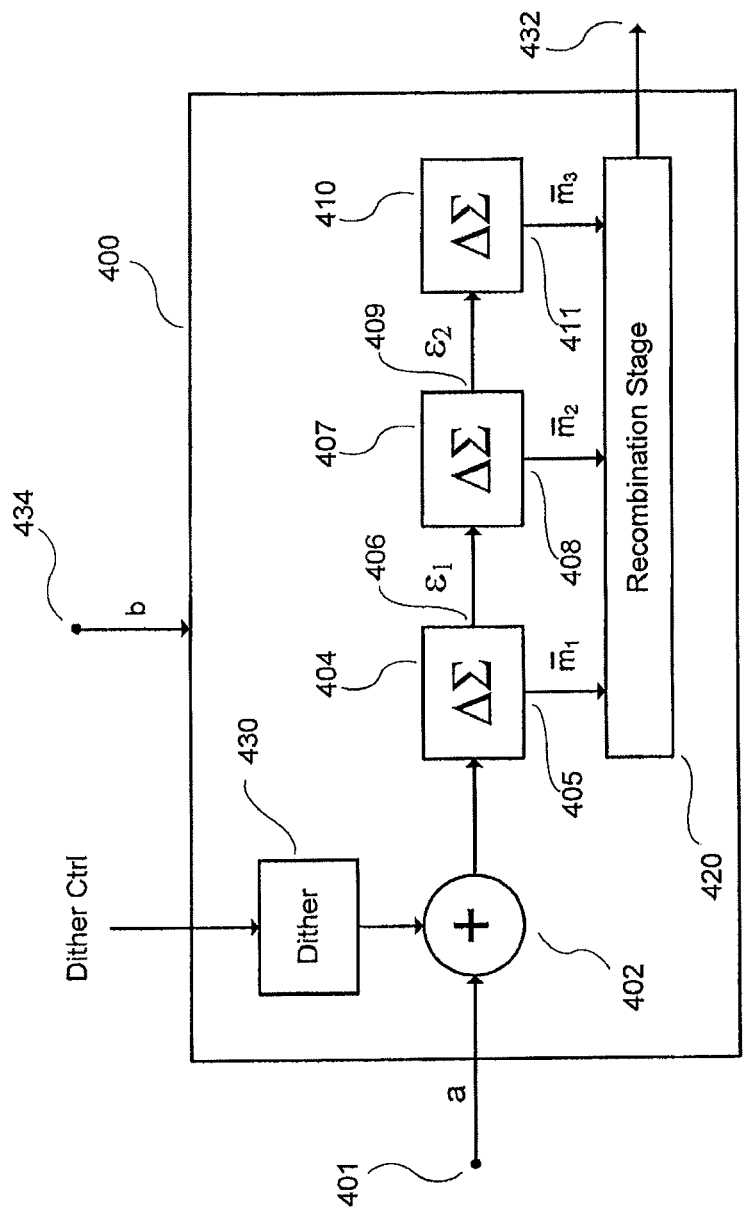
FIG. 11 shows a third possible form of the delta-sigma modulator in the system of FIG. 8.

FIG. 11 shows an example of a third order delta sigma modulator 400 in accordance with an embodiment of the present invention. Delta sigma modulator 400 comprises a first input terminal 401 for receiving a first input value a. Addition element 402 receives the first input value a from the first input terminal 401. A first delta sigma modulation stage 404, which may take the form of the delta sigma modulator 330 shown in FIG. 9 or the delta sigma modulator 341 shown in FIG. 10, is coupled to the output of the addition element 402. A first output 405 of the first delta sigma modulation stage 404, which is a pulse density modulated signal the average of which is $\overline{m}_1$, is coupled to a recombination stage 420. The second output 406 of the first delta sigma modulation stage 404 is the error $\varepsilon_1$ of the first delta sigma modulation stage 404, which is coupled to the input of a second delta sigma modulation stage 407, which may take the form of the delta sigma modulator 330 shown in FIG. 9 or the delta sigma modulator 341 shown in FIG. 10. A first output 408 of the second delta sigma modulation stage 407, which is a pulse density modulated signal the average of which is $\overline{m}_2$, is coupled to the recombination stage 420. The second output 409 of the second delta sigma modulation stage 407 is the error $\varepsilon_2$ of the second delta sigma modulation stage 407, which is coupled to the input of a third delta sigma modulation stage 410, which may take the form of the delta sigma modulator 330 shown in FIG. 9 or the delta sigma modulator 341 shown in FIG. 10. An output 411 of the third delta sigma modulation stage 410, which is a pulse density modulated signal the average of which is $\overline{m}_3$, is coupled to the recombination stage 420.

Delta sigma modulator 400 also comprises a second input terminal 434 for receiving a second input value b. Though not shown in FIG. 11, the second input value b is provided to delta sigma modulation stages 404, 407, 410. Second input value b determines the modular point of the delta sigma modulation stages, as discussed previously.

Recombination stage 420 combines the outputs $\overline{m}_1$, $\overline{m}_2$, and $\overline{m}_3$ from the three modulation stages 404, 407, 410 respectively to produce an output 432, in a manner which is in itself known to the person skilled in the art, and will therefore not be described further herein.

A dither unit 430, which receives a dither control signal, applies dither to the addition element 402. Dither is an intentionally applied form of noise that is applied in order to randomize quantisation error and prevent or at least greatly reduce tones forming in the output of delta sigma modulator 400. Dither is introduced to eliminate tones in the power/frequency response of the delta sigma modulator in a manner which is in itself known to the person skilled in the art, and will therefore not be described further herein. There has thus been described a clock generator, with various advantageous properties.

Such clock generators as described above are useful in a consumer/host device which includes audio reproduction or other audio signal processing, such as, but not limited to, a smartphone, games console, tablet, laptop computer, desktop computer, hi-fi system, or the like. In such applications, it is necessary for good audio reproduction to use a clock that has low jitter, and is at exactly the same frequency as the incoming data rate (or at a multiple thereof), to avoid dropping or adding data samples.

Figure 12:
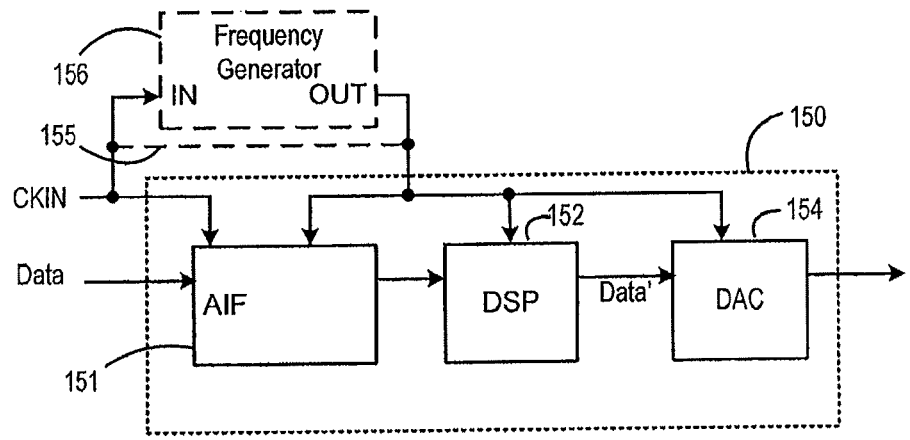
FIG. 12 shows a first known audio processing channel.

FIG. 12 shows a known audio processing channel 150, in this case possibly an audio reproduction channel accepting input digital data and outputting an analog signal suitable for directly or indirectly driving a speaker or headphone. The incoming data is transmitted in accordance with a clock or clocks (for example a frame clock and a bit clock in the case of a serial data format). One of these clocks is used to capture incoming data in an Audio Interface (AIF) 151. This data may then undergo some digital signal processing (for example interpolation or decimation) in a digital signal processing block (DSP) 152 to produce processed data Data', before being output through a delta-sigma DAC 154, the DAC and DSP being clocked according to some processing clock or clocks.

The processing clock may be just a (buffered) version of one of the interface clocks (as shown by the dashed line 155), or may pass through a frequency generator 156, for example to multiply an incoming frame clock LRCLK at say 48 kHz to a higher-speed clock (say 3072 kHz) CKsys that can be used to clock the output DAC 154.

However, the incoming clock may be subject to some jitter due to distortion or noise added in transmission, or a clock generator available on a digital processor chip may be of low quality. This jitter, when apparent on the sampling clock of the DAC, may cause poor audio quality in terms of noise, distortion or spurious intermodulation products.

Figure 13:
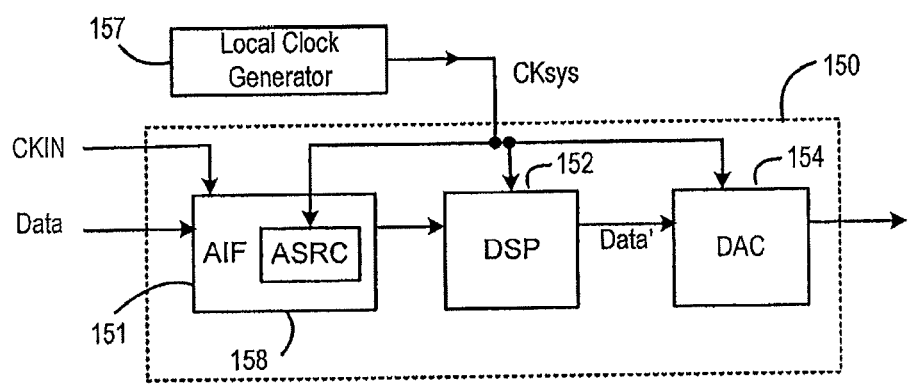
FIG. 13 shows a second known audio processing channel.

FIG. 13 shows an alternative audio processing channel 150, in which the DAC clock CKsys is derived from a local clock generator 157. However, particularly in systems with multiple channels from multiple sources, the local clock CKsys may not be synchronised to, or may not be the same actual frequency as, the incoming clock, even if it is the same nominal frequency. To cope with possible asynchronism between the incoming data and the local clock, an asynchronous sample-rate converter block 158 needs to be included in the signal chain, for example interpolating or up-sampling the input data up to a very high sample rate, smoothing it though a filter, and then decimating or down-sampling it to a desired sample rate. This takes up substantial digital hardware and power consumption, and may degrade the audio quality, particularly say if the input data is companded or otherwise non-linearly coded.

When the audio reproduction device 150 is in use in a consumer device such as a smartphone, PDA or digital camera or the like, that consumer device might include a good quality, low jitter, clock for its other functions, for example from a crystal generating a clock signal at 19.2 MHz or 12 MHz.

Figure 14:
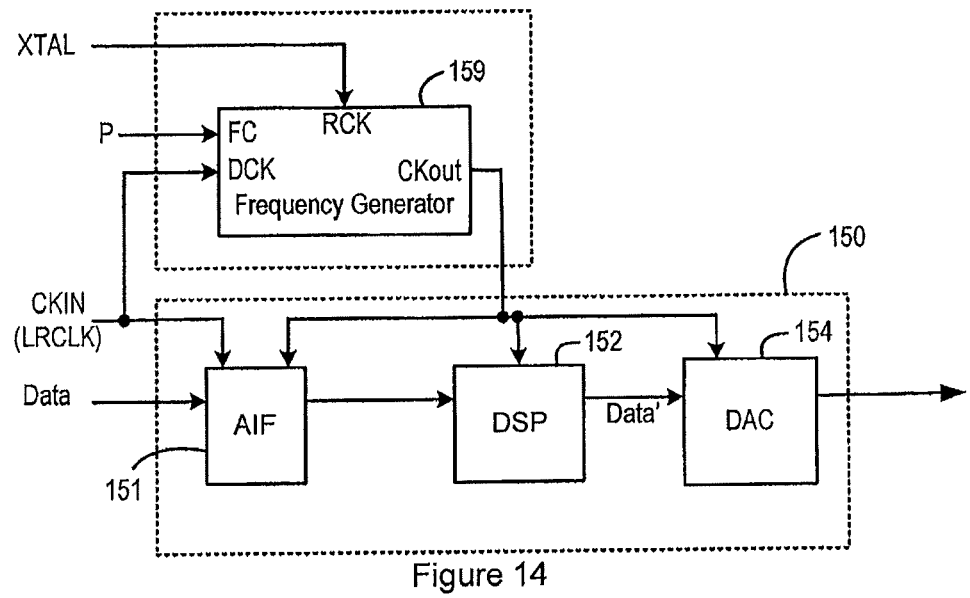
FIG. 14 shows an audio processing channel including a frequency generator in accordance with the invention.

FIG. 14 shows a configuration of an audio processing channel 150 that can advantageously be used in such circumstances, including a frequency generator 159, which may take the form of any of the frequency generators described herein, namely the frequency generators 10, 90, 110, 130, or similar.

In this case, the input data is accompanied by a low quality clock CKIN, for example an audio word clock LRCLK, whose nominal frequency is a fraction 1/P of the frequency of the output clock CKout. The clock CKIN can then be supplied to the first clock (DCK) input of the frequency generator 159, while the high quality clock from the crystal (XTAL) can be supplied to the second clock (RCK) input of the frequency generator 159. By suitable choice of the input values, as described above, the frequency generator 159 can be made to generate a clock signal CKout that is synchronised to the long term frequency of the incoming LRCLK, but preserves the low audio band jitter of the clock signal from the crystal (XTAL). This clock signal can then be supplied to each of the DSP 152 and DAC 154 decoding each of the channels of audio data. It is not necessary to provide an asynchronous sample rate converter (ASRC), at least on this one channel, or any other channels synchronised to it, e.g. the other one of a stereo pair, or other channels, with common LRCLK. As a result, this configuration compares favourably in terms of power, area etc with alternatives that require a low-jitter clock to be provided for the DAC and/or require asynchronous sample rate conversion to allow for different clock bases to maintain accurate frequency and to avoid dropping data samples.

In practice, the clock actually delivered to the DAC and/or DSP may be a divided-down version of the frequency generator output, but such possible dividers are omitted from the drawing for simplicity.

Figure 15:
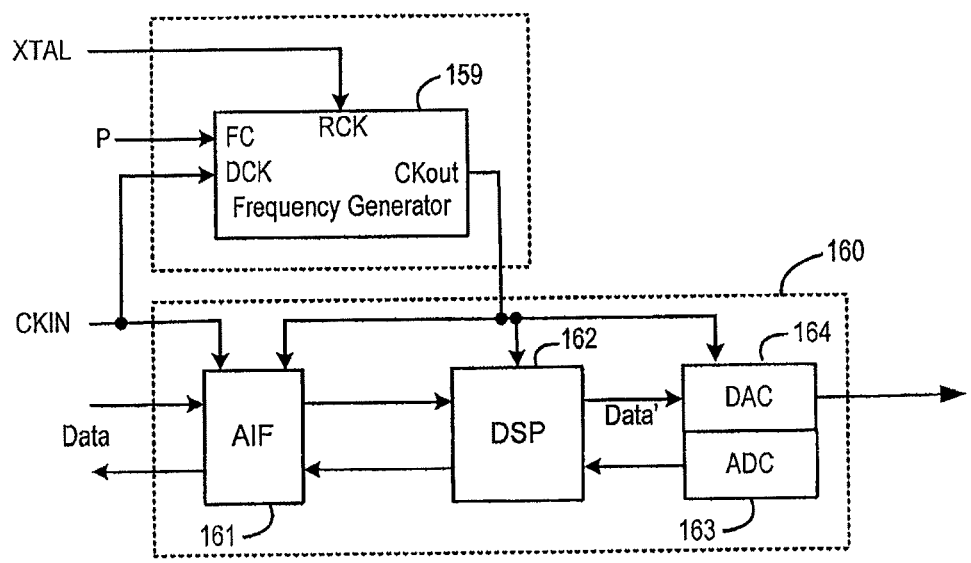
FIG. 15 shows a second system including a frequency generator in accordance with the invention.

FIG. 15 shows the form of an alternative and bidirectional audio processing channel 160. Thus, while an Audio Interface (AIF) 161 receives digital data, which it passes to a digital signal processing block (DSP) 162 to produce processed data Data' that is output through a DAC 164, an ADC 163 receives analog data, which it converts to digital form, before processing in the DSP 162 and output via the AIF 161. The ADC 163, as well as the DSP 162 and DAC 164, are clocked using the clock signal CKsys output from the frequency generator 159.

Figure 16:
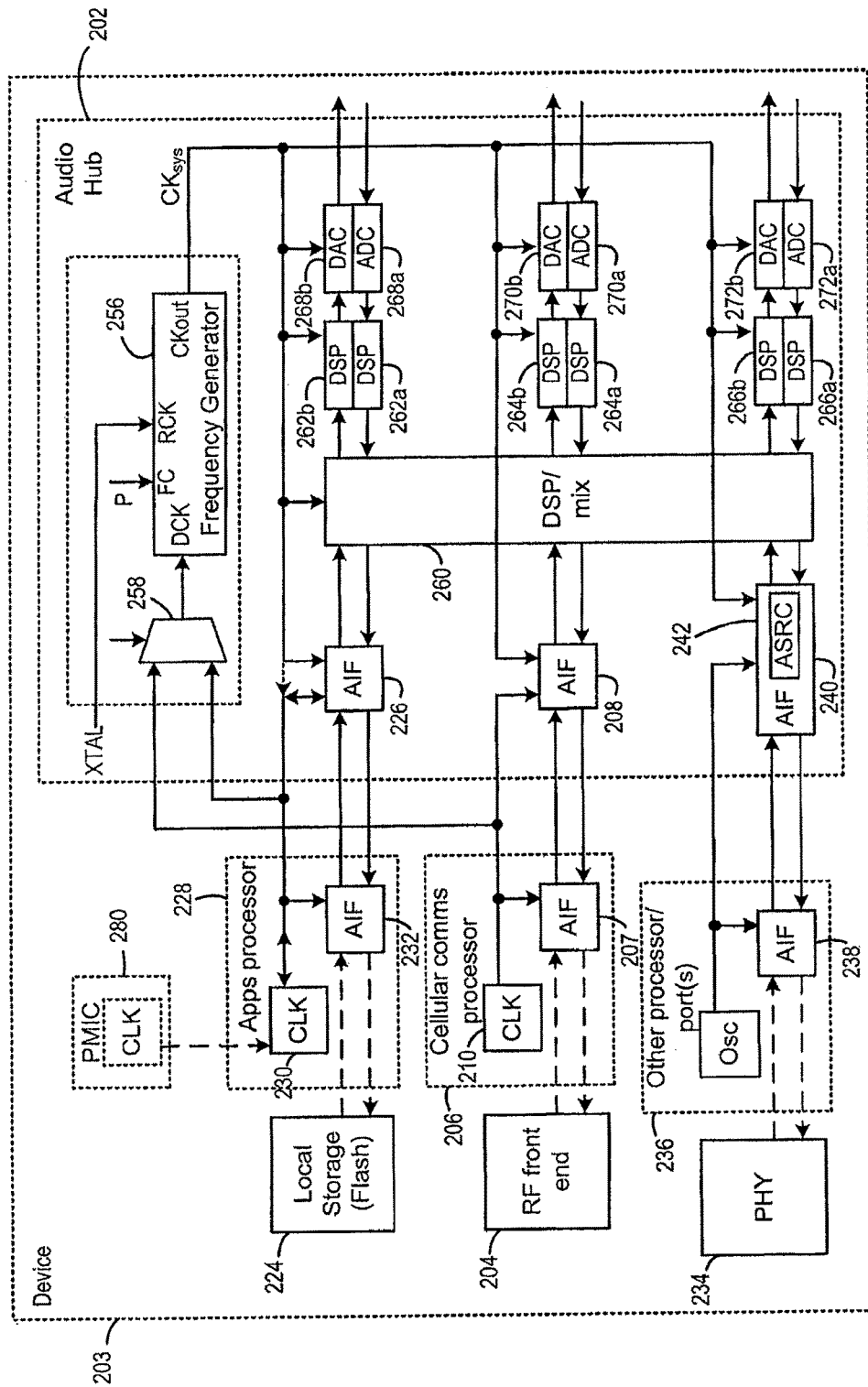
FIG. 16 shows a third system including a frequency generator in accordance with the invention.

FIG. 16 shows the use of a frequency generator as described, in a system with multiple audio channels and associated clocks. Specifically, FIG. 16 shows an audio hub circuit 202, which may be implemented as an integrated circuit, as used in a consumer host device 203 such as a smartphone or a portable audio convergence device for example.

Mobile telephony signals from and to an RF front end 204 are coupled through first processing circuitry, say a cellular communications ("comms") processor 206, comprising an audio interface (AIF) 207 to communicate these signals in the form of streams of sampled digital audio data to and from a first audio interface 208 on the audio hub 202. The comms processor 206 contains clock generation circuitry 210, which is synchronised to the RF receive/transmit channel, i.e. to the external phone network. The sampling rate of the audio data streams between the comms processor and the audio hub is thus synchronised to the external network.

The consumer/host device 203 may also playback or record audio signals stored in a local memory or removable media 224, coupled to a second interface 226 on the audio hub 202 via second processing circuitry, say an applications ("apps") processor 228, with associated clock circuitry 230 and comprising an audio interface 232 to communicate these signals in the form of streams of sampled digital audio data to and from this second interface. The sample rate associated with clocking the audio data into and out of the storage medium 224 need not necessarily be synchronised to any external reference clock: the sample rate needs only to be accurate and stable enough for people not to notice an error in pitch. The sampling rate of the audio data streams between the apps processor and the audio hub thus need not be synchronised to any external network or other external source.

The host/consumer device 203 may also have other sources of audio data, for example a Bluetooth™ transceiver, an FM-radio, or a Wi-Fi transceiver, or a High-Definition Multimedia Interface (HDMI), an S/PDIF interface, or a USB interface, represented in this case by the PHY block 234, channelled though further processing circuitry 236 comprising an audio interface 238 to communicate this audio data in the form of streams of sampled digital audio data to and from a third audio interface 240 on the audio hub 202. These further audio channels may need to be synchronised to external circuitry or networks in some cases, in other cases this may not be necessary. The sampling rate of the audio data streams between the PHY block and the audio hub may thus need to be synchronised to an external network or other external source in some use scenarios, but not in others.

The audio hub 202 also includes a DSP mixer block 260, which may comprise signal routing, mixing, conditioning and other DSP functions. Signals from the audio interfaces 208, 226, 240 or from ADC analog interfaces 268a, 270a, 272a (possibly after processing by optional dedicated DSP blocks 262a, 264a, 266a) can be mixed, conditioned or otherwise processed by DSP block 260, and resultant signals output via the audio interfaces 208, 226, 248 or from DACs 268b, 270b, 272b (possibly via optional dedicated DSP blocks 262b, 264b, 266b).

The mixer 260, the DSP blocks 262, 264, 266, and the DAC/ADC analog interfaces 268, 270, 272 are clocked by the clock signal CKsys (or possibly clock signals divided or otherwise derived from CKsys) generated by the clock generator 256, which may be comprised on the same audio hub integrated circuit.

The processing of all audio data streams within DSP block 260 preferably must be synchronous to the common clock CKsys, despite the diverse audio data sample rate synchronisation requirements arising from the various connected digital audio sources. So, preferably, the frequency generator circuit 256 may take the form of any of the frequency generators described herein, namely the frequency generators 10, 90, 110, 130, or similar.

In this illustrated embodiment, the clock signals generated by the comms processor 206 and by the apps processor 228 are passed to a multiplexer 258 (or equivalent arrangement). When the device is receiving a cellular telephone call, the multiplexer 258 is controlled so that the clock signal generated by the clock generator 210 on the comms processor 206 is passed to the DCK input of the frequency generator 256. The frequency generator output clock CKsys is used for processing data coupled through the comms processor to maintain data synchronism with the external network. There may be also a requirement to simultaneously couple data from the local storage 224 via the apps processor 228, for instance to record an incoming call, maybe as a local voice mail function. Since the sampling rate of this data need not be synchronised to any external clock reference, this data flow can also be based on the same clock CKsys, rather than using say some clock generated on the apps processor, which would then require an asynchronous sample rate conversion of the audio data stream in order to process synchronously with CKsys.

A telephony communications type device may, for example, also process audio data streams when not receiving a network call, e.g, for MP3/4 file playback. In this case the cellular comms processor 206 is preferably turned off to save power, and the main clock for the system may be generated on the apps processor 228, or possibly some other chip in the system, say a Power Management IC (PMIC) 280. Thus, in this situation, the multiplexer 258 is controlled so that the clock signal generated or used by the apps processor 228 is passed to the DCK input of the frequency generator 256.

The communications type device may also be required to process audio data streams to/from the other processor 236. In the embodiment of FIG. 16, to allow for use scenarios where these data streams must be synchronised to some external network or external clock source, while the audio hub clock CKsys is based on say the comms processor clock to maintain audio synchronism with a cellular network, the audio interface 240 comprises an asynchronous sample rate converter (ASRC) 242, to generate or accept an audio data stream synchronised to the CKsys clock from the asynchronous clock used by the processor 236.

In alternative embodiments, this ASRC may be separate from the audio interface, and the hub may comprise routing circuitry to route audio data streams from other audio interfaces though this ASRC, while allowing a path directly between the interface 240 and the DSP block 260, and possibly with a third input to the multiplexer 258 to pass the clock from the processor 236 to the clock generator 256, for scenarios where it is desirable to base CKsys on a clock from processor 236 and possibly sample rate convert some other channel, or where the audio data passing though processor 236 does not require to be synchronised to some external reference.

Alternative embodiments may have fewer or more channels, each possibly similar in nature to one of the three channels described.

Both the comms processor 206 and the apps processor 228 are large, complex digital circuits, so it is likely that any clock emanating therefrom will be corrupted by on-chip digital crosstalk and thus have high jitter. As mentioned above, the frequency generator 256 has the advantage of reducing this jitter to allow better audio quality. In an application like this, with a plurality of possible main clock sources, there is a further advantage in that, when the DCK input is switched to a different source, there will be no glitches in the output clock, and the output frequency will also not suddenly change, since it is locked to RCK, and the input to the NCO 24 in the frequency generator will only change slowly, with a time constant of the order of the sub-audio bandwidth of the outer loop. Thus the transition from one system clock to another, for example if recording an incoming voice message to local voice mail while playing back some MP3 music, will be inaudible to the listener.

In further system modes, it may be desirable to turn off even the apps processor 228, or at least to run it at a very low duty cycle just to keep the system in some standby mode. In such modes, the DCK input to the frequency generator may be disabled altogether, or at least periodically. As described above, the frequency generator will then continue to generate a clock at close to the nominal frequency, based on the held value of Nerr1 and the RCK frequency. Again, the transitions in and out of this standby mode, or as DCK periodically appears and disappears, will then occur without sudden change in phase or frequency of the output clock.

Also note that even if RCK were to temporarily disappear, the NCO would still continue oscillating at a frequency corresponding to the held value of Nerr2, so some clock is still available to maintain some functionality in the system. This frequency will still be reasonably accurate, within the resolution or error of the held value of Nerr2, albeit possibly drifting eventually due to any change in temperature or supply voltage.

Figure 17:
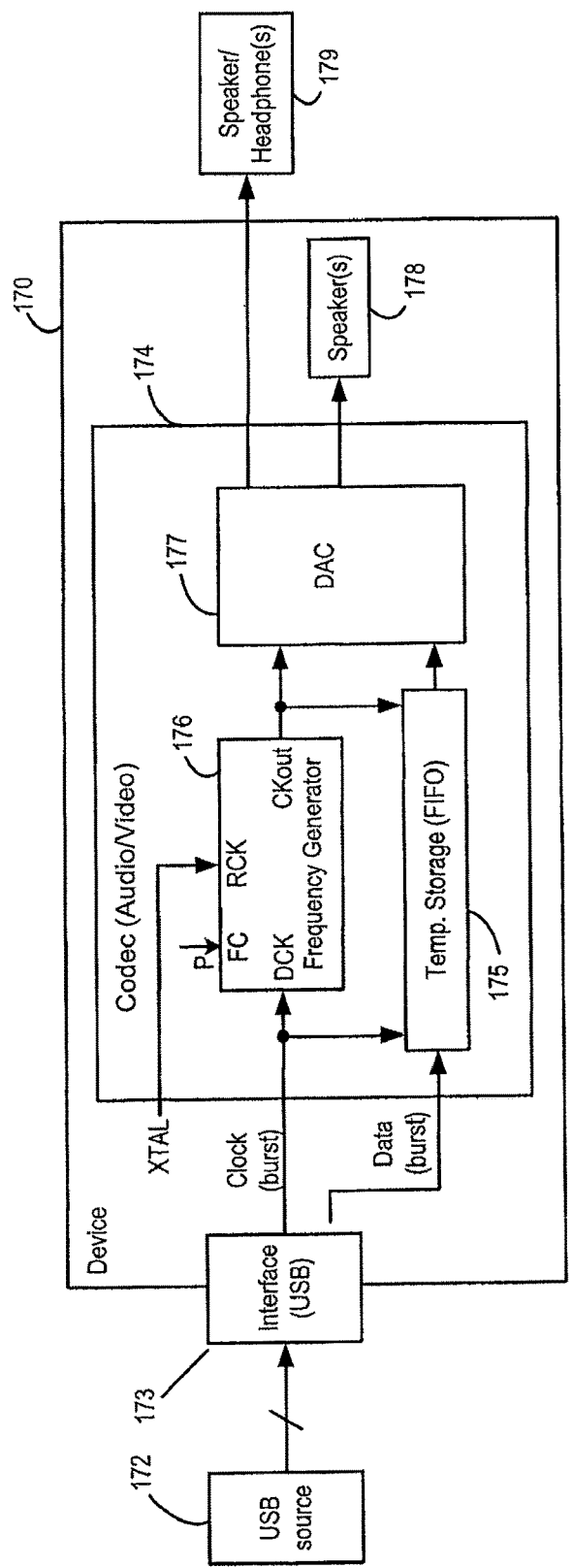
FIG. 17 shows a fourth system including a frequency generator in accordance with the invention.

FIG. 17 shows a device 170, where the data is supplied from a USB source 172. The data is supplied through an interface 173 of the device 170 to an audio and/or video codec. 174. The USB source 172 provides a burst of data every 1 ms or so for example. Typically, the data is buffered in temporary storage circuitry 175 such as a FIFO for example. The buffered data is passed to a digital-analog converter (DAC) 177, the analog output of which can be used, for example, to drive audio out of speaker(s) 178 internal to the device or speakers or headphones 179 external to the device.

The USB source 172 also provides a clock, typically at a frequency of 12 MHz. The clock might be present whenever the USB source 172 is available and connected to the codec 174, or it might go away between bursts of data. When the clock is only available periodically from the USB source 172, it is still necessary to have a stable local clock to provide continuous output data conversion by means of the DAC 177. It is also necessary to avoid glitches when the USB clock periodically returns, to avoid audible artefacts.

When the device 170 is a consumer/host device such as a smartphone, or a laptop computer for example, it might include a good quality, low jitter, clock for its other functions, for example from a crystal generating a clock signal at a known frequency. In such circumstances, a frequency generator or clock generator 176 can advantageously be used. The frequency generator 176 can take the form of any of the frequency generators described herein, namely the frequency generators 10, 90, 110, 130, or similar.

The USB clock can then be supplied to the first clock (DCK) input of the frequency generator 176, while the clock from the crystal (XTAL) can be supplied to the second clock (RCK) input of the frequency generator 176. A frequency control (FC) word P is also supplied to the frequency generator 176.

This has the effect that the clock signal CKout supplied to the codec 174 can be derived from the USB clock. However, when the USB clock and the associated data burst are not present, the output of the integrator 16 in the frequency generator 176 will stay constant, and hence the output frequency $f_{CKout}$ will remain at the same fixed ratio to the frequency of the clock from the crystal (RCK). Thus, the clock signal CKout supplied to the codec 174 will remain close to the intended frequency $f_{CKout}$.

There may be a small error in the frequency of the output clock CKout between each burst. The first filtered error signal Nerr1 will generally vary slightly from one DCK cycle to the next due to the finite resolution of the digital filter (i.e. quantisation noise) plus possibly any noise injected into the loop by any delta-sigma modulation of P or cycle-by-cycle variation of the synchronism of DCK to CKout. To achieve an error of a quarter of a 12 MHz DCK period, over the 1 ms interval between bursts of USB data, requires Nerr1 to have an accuracy of 1 part in 48000. If Nerr1 may be, say, 1/16 of full scale in some conditions, this requires a 20 bit resolution in Nerr1. The size of storage circuitry 175 may be increased slightly to allow temporary storage of a cache of data to accommodate temporary or short term variation in the output clock frequency; the long term frequency will be accurate and so errors in the clock will not accumulate so this storage should never overflow if appropriately sized.

In certain applications, it is undesirable to use off-chip components, such as a crystal (XTAL) for example, in order to save space and reduce the bill-of-materials cost for example, so it is desirable to generate the required accurate and low jitter clock using wholly on-chip circuitry.

It is difficult to design a wholly on-chip oscillator that is capable of outputting a clock signal having a stable frequency together with low jitter characteristics without having to design complex circuits that are large in integrated circuit (IC) die area and/or that require relatively large amounts of power to operate. Such IC design difficulties are due to factors such as: IC manufacturing tolerances in terms of doping levels and structural dimensions; and variation of IC operating temperature or supply voltage in subsequent use for example.

In order to overcome these problems, a solution has been devised wherein a clock generator is provided with a plurality of clock signals generated wholly on-chip.

Figure 18:
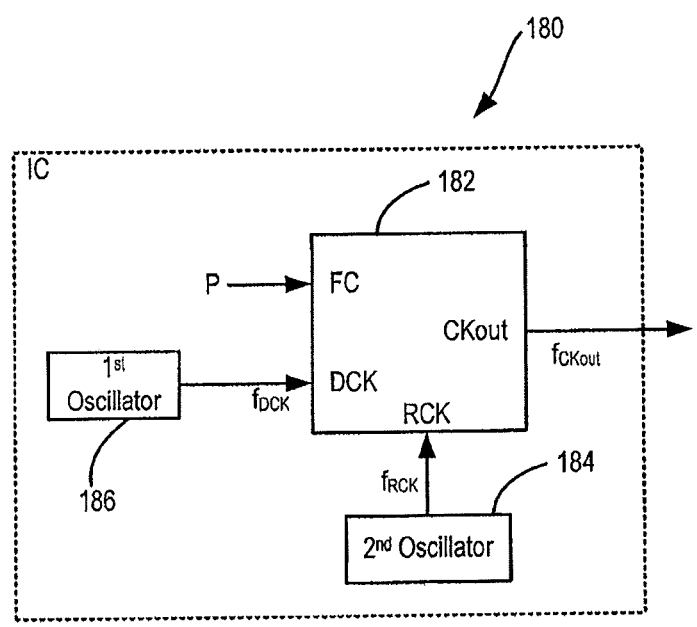
FIG. 18 shows a fifth system including a frequency generator in accordance with the invention.

FIG. 18 illustrates an example of an integrated circuit 180 comprising a clock generator 182 and first and second on-chip oscillators 186, 184. The clock generator 182 can be any of the clock generators as herein previously described, namely the frequency generators 10, 90, 110, 130, or similar.

The first oscillator 186 may be designed especially so as to have an output frequency insensitive to temperature and supply voltage, but with little attention paid to jitter. This oscillator may for example be an entirely on-chip RC-based oscillator, using a temperature stable on-chip capacitance as is commonly available and a zero-temperature-coefficient resistance. The zero-temperature-coefficient resistance may be obtained by an appropriately designed network comprising a mixture of types of on-chip resistors of possibly positive and negative temperature coefficients. To obtain an initial absolute frequency accuracy, one or more of the components of the first oscillator 186 may be trimmed, i.e. adjusted, during manufacture or post-manufacture so that the first oscillator 186 outputs a very accurate desired frequency. Once trimmed, such a time constant type oscillator will have a relatively stable, i.e. relatively accurate, output frequency but may have high jitter characteristics.

This first oscillator 186 may be one of the types disclosed above and illustrated in FIG. 7(a) (b) or (e), comprising digitally programmable resistors, capacitors or other elements, the controlling digital bits of which may be stored in on-chip non-volatile memory such as ROM or fusible elements.

The first oscillator 186 is connected to the clock generator 182, so that the output of the first oscillator 186 is supplied as the first input clock signal (DCK) of the clock generator 182. The first input clock signal DCK is therefore a relatively accurate frequency clock signal, but with a relatively high level of jitter.

In contrast to the first oscillator, a second oscillator 184 should be designed to generate a low jitter clock, but with less attention paid to frequency accuracy or stability. The second oscillator 184 may be formed by an oscillator comprising a wholly on-chip resonant circuit, for example an LC-type oscillator comprising an on-chip inductor L and an on-chip capacitance C. Without the impracticability of resorting to designing complex circuits as discussed above, a relatively low power resonant oscillator may be designed using an on-chip inductor to provide an output clock signal that has low jitter characteristics, but it is difficult to also simultaneously provide an output frequency that is very insensitive to temperature and supply voltage. The difficulty is increased for a wholly on-chip LC oscillator since, in the current art, a resonant circuit comprising an on-chip inductor (L) has a lower Q-factor than an equivalent resonant circuit comprising an off-chip inductor. The second oscillator will thus generate a clock with low jitter, but may have a frequency that varies over time.

The second oscillator 184 is connected to the clock generator 182, so that the output of the second oscillator 184 is supplied as the second input clock signal (RCK) of the clock generator 182. The second input clock signal RCK is therefore a relatively low jitter clock signal, but with relatively poor frequency accuracy.

As discussed above, the clock generator 182 acts to generate an output clock signal that has the frequency accuracy of the clock signal provided by the first oscillator 186, but has the low jitter characteristic of the clock signal provided by the second oscillator 184.

The design of two separate oscillators, each focussed on separate aspects of performance, is much easier, gives a less complex and hence cheaper circuit, and consumes less power, despite the additional circuitry of the clock generator, than attempting to satisfy all the requirements with a single oscillator.

As a result, the circuit shown in FIG. 18 is particularly useful in situations where it is undesirable, or not possible for whatever reason, to use off-chip components in the generation of an output clock (CKout) that is stable, i.e. accurate, and that has low jitter.

In generating, completely on-chip, two clock signals, wherein one clock signal (DCK) has an appropriate, i.e. desired, frequency and is relatively accurate over time but has relatively high jitter, and the other clock signal (RCK) has an inappropriate frequency that is relatively inaccurate but that has relatively low jitter characteristics, and using these as the clock inputs to a clock generator as described above, the best characteristics of each of the on-chip generated clock signals (RCK, DCK) is present in the clock generator output signal (CKout).

This means that the output clock signal CKout can be generated from the second input clock signal DCK at a desired exact frequency ratio by suitable choice of a value for P, but that the jitter (within the frequency band of interest) on the output clock signal CKout is only dependent on the low level of jitter on the second input clock signal RCK.

It should be noted that the second oscillator could alternatively be formed from some other resonant relatively high-Q element, for example, by means of a MEMS (Micro-Electro-Mechanical-System) type oscillator as part of the integrated circuit.

There is therefore provided a frequency generator for generating a signal at a desired frequency, with advantageous characteristics.

What is claimed is:

1. An integrated circuit comprising:
  a first on-chip oscillator for generating a first oscillator clock signal, the first oscillator clock signal having a relatively high level of jitter and relatively accurate frequency;
  a second on-chip oscillator for generating a second oscillator clock signal, the second oscillator clock signal having a relatively low level of jitter and relatively inaccurate frequency; and
  a clock generator, for generating an output clock signal from the first and second oscillator clock signals,
  wherein the clock generator comprises:
  an input, for receiving a signal representing a desired value of a first frequency ratio between a frequency of the output clock and a nominal frequency of the first oscillator clock signal;
  a first loop, for generating a first error signal representing a difference between said desired value of said first frequency ratio and an actual value of a second frequency ratio between the frequency of the output clock and a frequency of the first oscillator clock signal;
  a second loop, for generating a second error signal representing a difference between the first error signal and a third frequency ratio between the frequency of the output clock and a frequency of the second oscillator clock signal; and a numerically controlled oscillator, for receiving the second error signal and generating the output clock signal, such that the output clock signal has the frequency accuracy of the first oscillator clock signal and the jitter characteristics of the second oscillator clock signal over a range of frequencies.

2. An integrated circuit according to claim 1, wherein the first oscillator clock signal has a more accurate frequency than the second oscillator clock signal, and wherein the second oscillator clock signal has a lower level of jitter than the first oscillator clock signal.

3. An integrated circuit according to claim 1, wherein the first loop comprises:

a first frequency comparator, for generating a first frequency comparison signal based on the second frequency ratio; and a first subtractor, for forming a signal representing said difference between said desired value of said first frequency ratio and the actual value of said second frequency ratio.

4. An integrated circuit according to claim 3, wherein the first frequency comparator comprises a first counter, for counting a number of periods of the output clock signal per period of the first oscillator clock signal.

5. An integrated circuit according to claim 3, wherein the first loop further comprises a first digital filter, for receiving an output of the first subtractor, and filtering it to form the first error signal.

6. An integrated circuit according to claim 5, wherein the first digital filter is a low pass filter.

7. An integrated circuit according to claim 5, wherein the first digital filter is a first order integrator.

8. An integrated circuit according to claim 1, wherein the second loop comprises:

a second frequency comparator, for generating a second frequency comparison signal based on the third frequency ratio; and a second subtractor, for forming a signal representing said difference between the first error signal and the second frequency comparison signal.

9. An integrated circuit according to claim 8, wherein the second frequency comparator comprises a second counter, for counting a number of periods of the output clock signal per period of the second oscillator clock signal.

10. An integrated circuit according to claim 8, wherein the second loop further comprises a second digital filter, for receiving an output of the second subtractor, and filtering it to form the second error signal.

11. An integrated circuit according to claim 10, wherein the second digital filter is a low pass filter.

12. An integrated circuit according to claim 10, wherein the second digital filter is a first order integrator.

13. An integrated circuit according to claim 1, wherein the numerically controlled oscillator comprises a digital-analog converter, an output of which controls the frequency of the output clock signal.

14. An integrated circuit according to claim 1, wherein the numerically controlled oscillator comprises a set of circuit elements, said set of circuit elements being digitally programmable such that a multi-bit binary signal representing or derived from a numerical input can control which of the circuit elements are connected, and can thus control a frequency of the numerically controlled oscillator.

15. An integrated circuit according to claim 1, further comprising:

a first frequency divider, connected to divide the frequency of the output clock signal before passing to the first frequency comparator, and a second frequency divider, connected to divide the frequency of the output clock signal before passing to the second frequency comparator.

16. An integrated circuit according to claim 1, wherein the first on-chip oscillator is an RC-oscillator, comprising a temperature stable capacitance and a zero-temperature-coefficient resistance.

17. An integrated circuit according to claim 1, wherein the second on-chip oscillator is an LC-type oscillator.

18. A device, comprising one of: a portable electronic device, a mobile phone, a PDA, a netbook computer, a laptop computer, a tablet computer, a computer, a smartphone, a digital camera or an audio convergence device, containing an audio processing integrated circuit, wherein the audio processing integrated circuit comprises:

a first on-chip oscillator for generating a first oscillator clock signal, the first oscillator clock signal having a relatively high level of jitter and relatively accurate frequency;

a second on-chip oscillator for generating a second oscillator clock signal, the second oscillator clock signal having a relatively low level of jitter and relatively inaccurate frequency; and a clock generator, for generating an output clock signal from the first and second oscillator clock signals, wherein the clock generator comprises:

an input, for receiving a signal representing a desired value of a first frequency ratio between a frequency of the output clock and a nominal frequency of the first oscillator clock signal;

a first loop, for generating a first error signal representing a difference between said desired value of said first frequency ratio and an actual value of a second frequency ratio between the frequency of the output clock and a frequency of the first oscillator clock signal;

a second loop, for generating a second error signal representing a difference between the first error signal and a third frequency ratio between the frequency of the output clock and a frequency of the second oscillator clock signal; and a numerically controlled oscillator, for receiving the second error signal and generating the output clock signal, such that the output clock signal has the frequency accuracy of the first oscillator clock signal and the jitter characteristics of the second oscillator clock signal over a range of frequencies.

\* \* \* \* \*